US012525436B2

(12) United States Patent
Bhutta et al.

(10) Patent No.: US 12,525,436 B2
(45) Date of Patent: Jan. 13, 2026

(54) RF IMPEDANCE MATCHING WITH CONTINUOUS WAVE AND PULSING SOURCES

(71) Applicant: ASM IP Holding, B.V., Almere (NL)

(72) Inventors: Imran Ahmed Bhutta, Moorestown, NJ (US); Tomislav Lozic, Gilbert, AZ (US)

(73) Assignee: ASM IP Holding, B.V. (NL)

( * ) Notice: Subject to any disclaimer, the term of this patent is extended or adjusted under 35 U.S.C. 154(b) by 187 days.

(21) Appl. No.: 18/496,238

(22) Filed: Oct. 27, 2023

(65) Prior Publication Data

US 2024/0145216 A1 May 2, 2024

Related U.S. Application Data

(60) Provisional application No. 63/435,433, filed on Dec. 27, 2022, provisional application No. 63/420,829, filed on Oct. 31, 2022, provisional application No. 63/420,855, filed on Oct. 31, 2022.

(51) Int. Cl.
*H01J 37/32* (2006.01)

(52) U.S. Cl.
CPC .. *H01J 37/32183* (2013.01); *H01J 37/32128* (2013.01); *H01J 37/32146* (2013.01); *H01J 37/32981* (2013.01); *H01J 2237/332* (2013.01); *H01J 2237/334* (2013.01)

(58) Field of Classification Search
None
See application file for complete search history.

(56) References Cited

U.S. PATENT DOCUMENTS

| | | | | |
|---|---|---|---|---|
| 6,818,562 | B2 * | 11/2004 | Todorow | H01J 37/321 438/10 |
| 8,264,154 | B2 | 9/2012 | Banner | |
| 8,659,335 | B2 | 2/2014 | Nagarkatti | |
| 9,509,266 | B2 | 11/2016 | Coumou | |
| 9,721,758 | B2 | 8/2017 | Coumou | |
| 9,876,476 | B2 | 1/2018 | Coumou | |
| 10,593,519 | B2 * | 3/2020 | Yamada | H01J 37/32146 |
| 12,148,595 | B2 * | 11/2024 | Cui | H01J 37/32146 |
| 2022/0084795 | A1 * | 3/2022 | Collins | C23C 16/455 |
| 2022/0130713 | A1 * | 4/2022 | Paul | H01J 37/32357 |
| 2023/0071366 | A1 * | 3/2023 | Citla | H01L 21/3065 |

* cited by examiner

*Primary Examiner* — Kenneth B Wells
(74) *Attorney, Agent, or Firm* — The Belles Group, P.C. (ASM)

(57) ABSTRACT

In one embodiment, a system for semiconductor fabrication includes a continuous wave (CW) radio frequency (RF) source and a pulsing RF source. The system further includes a matching network positioned between the CW RF source and the load and a control circuit. The control circuit receives one or more signals indicative of the pulsing RF signal, and selects a portion of the pulsing RF signal. The control circuit then samples at least one parameter during the selected portion of the pulsing RF signal. Based on the at least one parameter, the control circuit causes an alteration of the at least one variable reactance element, which causes the matching network to impedance match between the CW RF source and the load.

20 Claims, 13 Drawing Sheets

RF IMPEDANCE MATCHING WITH CONTINUOUS WAVE AND PULSING SOURCES

CROSS REFERENCE TO RELATED APPLICATIONS

The present application claims the benefit of U.S. Provisional Patent Application No. 63/420,829 filed on Oct. 31, 2022, U.S. Provisional Application No. 63/420,855 filed on Oct. 31, 2022, and U.S. Provisional Patent Application No. 63/435,433 filed on Dec. 27, 2022, which are incorporated herein by reference in their entirety.

BACKGROUND

In making semiconductor devices such as microprocessors, memory chips, and other integrated circuits, the semiconductor device fabrication process uses plasma processing at different stages of fabrication. Plasma processing involves energizing a gas mixture by imparting energy to the gas molecules by the introduction of RF (radio frequency) energy into the gas mixture. This gas mixture is typically contained in a vacuum chamber, also called a plasma chamber, and the RF energy is introduced through electrodes or other means in the chamber. In a typical plasma process, the RF generator generates power at the desired RF frequency and power, and this power is transmitted through the RF cables and networks to the plasma chamber.

To provide efficient transfer of power from the RF generator to the plasma chamber, an RF matching network is positioned between the RF generator and the plasma chamber. The purpose of the RF matching network is to transform the plasma impedance to a value suitable for the RF generator. In many cases, particularly in the semiconductor fabrication processes, the RF power is transmitted through 50 Ohm coaxial cables and the system impedance (output impedance) of the RF generators is also 50 Ohm. On the other hand, the impedance of the plasma, driven by the RF power, varies based on the plasma chemistry and other conditions inside the plasma chamber. This impedance must be transformed to non-reactive 50 Ohm (i.e., 50+j0) for maximum power transmission. An RF matching network performs this task of continuously transforming the plasma impedance to 50 Ohm for the RF generator. In most cases, this transformation is done such that the impedance on the input side of the RF matching network becomes 50+j0 Ohm, that is, a purely resistive 50 Ohm.

An RF matching network may comprise variable capacitors and a microprocessor-based control circuit to control the capacitors. The value and size of the variable capacitors are influenced by the power handling capability, frequency of operation, and impedance range of the plasma chamber. The predominant variable capacitor in use in RF matching networks is the vacuum variable capacitor (VVC). The VVC is an electromechanical device, consisting of two concentric metallic rings that move in relation to each other to change the capacitance. An alternative to the VVC is the electronically variable capacitor (EVC) (see, e.g., U.S. Pat. No. 7,251,121, incorporated herein by reference in its entirety), which is faster than the VVC and thus enables a reduction in semiconductor processing tune time. EVC-based matching networks are a type of solid state matching network.

In semiconductor fabrication processing, sometimes multiple RF power sources are used to ignite and/or control the plasma properties. These multiple sources can have the same frequency or different frequencies. Similarly, the power levels of each power source may be different. In addition to the above differences, one of the sources may be operating in continuous wave (CW) mode, while the other may be pulsing. The coexistence of two types of RF sources in a single system, however, may impact the way matching may be performed. For example, the pulsing RF source may cause the plasma to pulse. Thus, the matching between the CW source and the plasma may need to account for a pulsing plasma, rather than a plasma presenting a more constant impedance.

BRIEF SUMMARY

The present disclosure may be directed to a system comprising a continuous wave (CW) radio frequency (RF) source configured to provide a CW RF signal to a load; and a pulsing RF source configured to provide a pulsing RF signal to the load; a matching network operably coupled between the CW RF source and the load, the matching network comprising at least one variable reactance element; and a control circuit operably coupled to (a) the matching network and (b) at least one of the pulsing RF source or a sensor positioned between the pulsing RF source and the load, wherein the control circuit is configured to receive one or more signals indicative of the pulsing RF signal; select a portion of the pulsing RF signal; sample at least one parameter during the selected portion of the pulsing RF signal; and cause the matching network to impedance match between the CW RF source and the load by altering the at least one variable reactance element based on the sampled at least one parameter.

In another aspect, a method of impedance matching includes providing, from a CW RF source, a CW RF signal to a load; providing, from a pulsing RF source, a pulsing RF signal to the load; operably coupling a matching network between the CW RF source and the load, the matching network comprising at least one variable reactance element; operably coupling a control circuit to (a) the matching network and (b) at least one of the pulsing RF source or a sensor positioned between the pulsing RF source and the load; receiving one or more signals indicative of the pulsing RF signal; selecting a portion of the pulsing RF signal; sampling at least one parameter during the selected portion of the pulsing RF signal; and causing the matching network to impedance match between the CW RF source and the load by altering the at least one variable reactance element based on the sampled at least one parameter.

In another aspect, a semiconductor processing tool includes a plasma chamber configured to deposit a material onto a substrate or etch a material from the substrate; and a first impedance matching network operably coupled to the plasma chamber and configured to be operably coupled to a CW RF source configured to provide a CW RF signal to the plasma chamber, the first impedance matching network comprising at least one variable reactance element; and a second impedance matching network operably coupled to the plasma chamber and configured to be operably coupled to a pulsing RF source configured to provide a pulsing RF signal to the load; and a control circuit operably coupled to (a) the first impedance matching network and (b) at least one of the pulsing RF source or a sensor positioned between the pulsing RF source and the load, wherein the control circuit is configured to receive one or more signals indicative of the pulsing RF signal; select a portion of the pulsing RF signal; sample at least one parameter during the selected portion of the pulsing RF signal; and cause the first impedance matching network to impedance match between the CW RF source and the load by altering the at least one variable reactance element based on the sampled at least one parameter.

In another aspect, a method of fabricating a semiconductor includes placing a substrate in a plasma chamber configured to deposit a material layer on the substrate or etch a material layer from the substrate; providing, from a CW RF source, a CW RF signal to the plasma chamber; providing, from a pulsing RF source, a pulsing RF signal to the plasma chamber; operably coupling a matching network between the CW RF source and the plasma chamber, the matching network comprising at least one variable reactance element; receiving one or more signals indicative of the pulsing RF signal; selecting a portion of the pulsing RF signal; sampling at least one parameter during the selected portion of the pulsing RF signal; and causing the matching network to impedance match between the CW RF source and the load by altering the at least one variable reactance element based on the sampled at least one parameter.

BRIEF DESCRIPTION OF THE DRAWINGS

The present disclosure will become more fully understood from the detailed description and the accompanying drawings, wherein.

DETAILED DESCRIPTION

Figure 1:
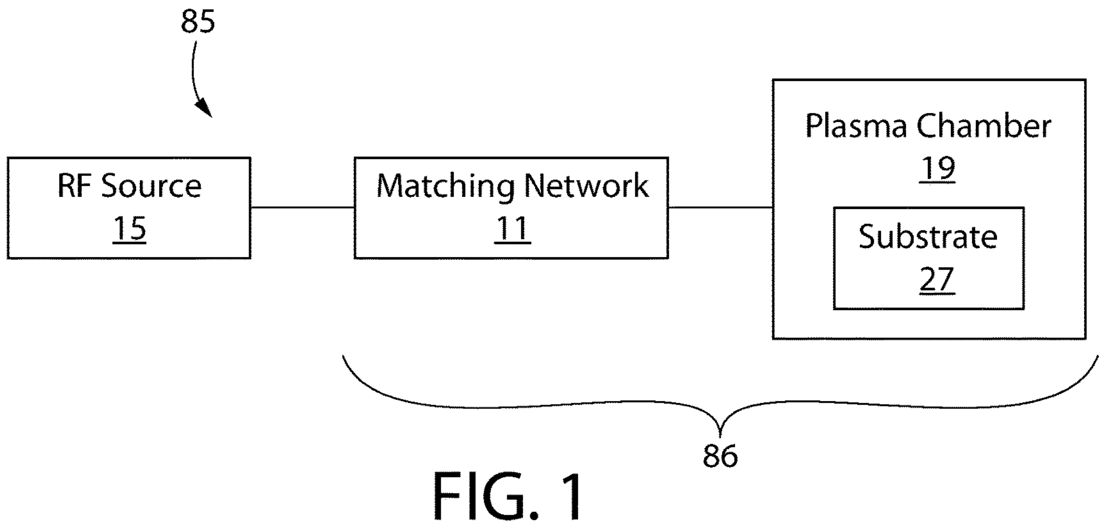
FIG. 1 is a block diagram of an embodiment of a semiconductor processing system.

The following description of the preferred embodiment(s) is merely exemplary in nature and is in no way intended to limit the invention or inventions. The description of illustrative embodiments is intended to be read in connection with the accompanying drawings, which are to be considered part of the entire written description. In the description of the exemplary embodiments disclosed herein, any reference to direction or orientation is merely intended for convenience of description and is not intended in any way to limit the scope of the present inventions. The discussion herein describes and illustrates some possible non-limiting combinations of features that may exist alone or in other combinations of features. Furthermore, as used herein, the term "or" is to be interpreted as a logical operator that results in true whenever one or more of its operands are true. Furthermore, as used herein, the phrase "based on" is to be interpreted as meaning "based at least in part on," and therefore is not limited to an interpretation of "based entirely on."

Features of the present inventions may be implemented in software, hardware, firmware, or combinations thereof. The computer programs described herein are not limited to any particular embodiment, and may be implemented in an operating system, application program, foreground or background processes, driver, or any combination thereof. The computer programs may be executed on a single computer or server processor or multiple computer or server processors.

Processors described herein may be any central processing unit (CPU), microprocessor, micro-controller, computational, or programmable device or circuit configured for executing computer program instructions (e.g., code). Various processors may be embodied in computer and/or server hardware of any suitable type (e.g., desktop, laptop, notebook, tablets, cellular phones, etc.) and may include all the usual ancillary components necessary to form a functional data processing device including without limitation a bus, software and data storage such as volatile and non-volatile memory, input/output devices, graphical user interfaces (GUIs), removable data storage, and wired and/or wireless communication interface devices including Wi-Fi, Bluetooth, LAN, etc.

Computer-executable instructions or programs (e.g., software or code) and data described herein may be programmed into and tangibly embodied in a non-transitory computer-readable medium that is accessible to and retrievable by a respective processor as described herein which configures and directs the processor to perform the desired functions and processes by executing the instructions encoded in the medium. A device embodying a programmable processor configured to such non-transitory computer-executable instructions or programs may be referred to as a "programmable device", or "device", and multiple programmable devices in mutual communication may be referred to as a "programmable system." It should be noted that non-transitory "computer-readable medium" as described herein may include, without limitation, any suitable volatile or non-volatile memory including random access memory (RAM) and various types thereof, read-only memory (ROM) and various types thereof, USB flash memory, and magnetic or optical data storage devices (e.g., internal/external hard disks, floppy discs, magnetic tape CD-ROM, DVD-ROM, optical disk, ZIP™ drive, Blu-ray disk, and others), which may be written to and/or read by a processor operably connected to the medium.

In certain embodiments, the present invention may be embodied in the form of computer-implemented processes and apparatuses such as processor-based data processing and communication systems or computer systems for practicing those processes. The present invention may also be embodied in the form of software or computer program code embodied in a non-transitory computer-readable storage medium, which when loaded into and executed by the data processing and communications systems or computer systems, the computer program code segments configure the processor to create specific logic circuits configured for implementing the processes.

In the following description, where circuits are shown and described, one of skill in the art will recognize that, for the sake of clarity, not all peripheral circuits or components are shown in the figures or described in the description. Further, the terms "couple" and "operably couple" can refer to a direct or indirect coupling of two components of a circuit.

The following description of the preferred embodiment(s) is merely exemplary in nature and is in no way intended to limit the invention or inventions. The description of illustrative embodiments is intended to be read in connection with the accompanying drawings, which are to be considered part of the entire written description. In the description of the exemplary embodiments disclosed herein, any reference to direction or orientation is merely intended for convenience of description and is not intended in any way to limit the scope of the present invention. Relative terms such as "lower," "upper," "horizontal," "vertical," "above," "below," "up," "down," "left," "right," "top," "bottom," "front" and "rear" as well as derivatives thereof (e.g., "horizontally," "downwardly," "upwardly," etc.) should be construed to refer to the orientation as then described or as shown in the drawing under discussion. These relative terms are for convenience of description only and do not require that the apparatus be constructed or operated in a particular orientation unless explicitly indicated as such. Terms such as "attached," "affixed," "connected," "coupled," "interconnected," "secured" and other similar terms refer to a relationship wherein structures are secured or attached to one another either directly or indirectly through intervening structures, as well as both movable or rigid attachments or relationships, unless expressly described otherwise. The discussion herein describes and illustrates some possible non-limiting combinations of features that may exist alone or in other combinations of features. Furthermore, as used herein, the term "or" is to be interpreted as a logical operator that results in true whenever one or more of its operands are true. Furthermore, as used herein, the phrase "based on" is to be interpreted as meaning "based at least in part on," and therefore is not limited to an interpretation of "based entirely on."

As used throughout, ranges are used as shorthand for describing each and every value that is within the range. Any value within the range can be selected as the terminus of the range. In addition, all references cited herein are hereby incorporated by referenced in their entireties. In the event of a conflict in a definition in the present disclosure and that of a cited reference, the present disclosure controls.

Semiconductor Processing System

Referring to FIG. 1, a semiconductor device processing system 85 utilizing an RF generator 15 is shown. The system 85 includes an RF generator 15 and a semiconductor processing tool 86. The semiconductor processing tool 86 includes a matching network 11 and a plasma chamber 19. In other embodiments, the generator 15 or other power source can form part of the semiconductor processing tool.

The semiconductor device can be a microprocessor, a memory chip, or other type of integrated circuit or device. A substrate 27 can be placed in the plasma chamber 19, where the plasma chamber 19 is configured to deposit a material layer onto the substrate 27 or etch a material layer from the substrate 27. Plasma processing involves energizing a gas mixture by imparting energy to the gas molecules by introducing RF energy into the gas mixture. This gas mixture is typically contained in a vacuum chamber (the plasma chamber 19), and the RF energy is typically introduced into the plasma chamber 19 through electrodes. Thus, the plasma can be energized by coupling RF power from an RF source 15 into the plasma chamber 19 to perform deposition or etching.

In a typical plasma process, the RF generator 15 generates power at a radio frequency which is typically within the range of 3 kHz and 300 GHz—and this power is transmitted through RF cables and networks to the plasma chamber 19. In order to provide efficient transfer of power from the RF generator 15 to the plasma chamber 19, an intermediary circuit is used to match the fixed impedance of the RF generator 15 with the variable impedance of the plasma chamber 19. Such an intermediary circuit is commonly referred to as an RF impedance matching network, or more simply as an RF matching network. The purpose of the RF matching network 11 is to transform the variable plasma impedance to a value that more closely matches the fixed impedance of the RF generator 15. Commonly owned U.S. Publication Nos. 2021/0183623 and 2021/0327684, the disclosures of which are incorporated herein by reference in their entirety, provide examples of such matching networks.

Matching Network

Figure 2:
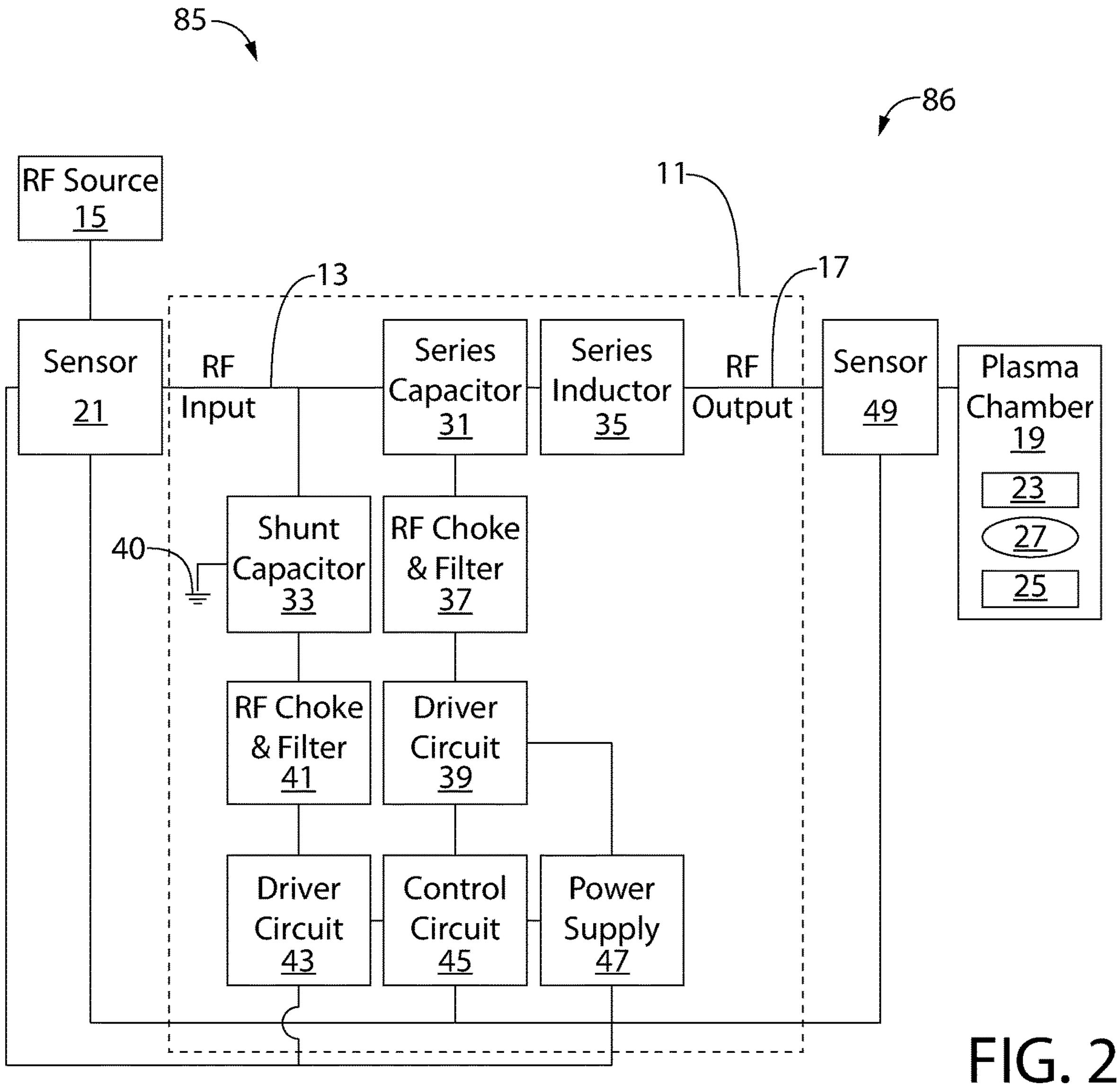
FIG. 2 is a block diagram of an embodiment of a semiconductor processing system having an L-configuration matching network.

FIG. 2 is a block diagram of an embodiment of a semiconductor processing system 85 having a processing tool 86 that includes an L-configuration RF impedance matching network 11. As will be discussed in further detail below, the exemplified matching network 11 utilizes electronically variable capacitors (EVCs) for both the shunt variable capacitor 33 and the series variable capacitor 31. It is noted that the invention is not so limited. For example, one of the EVCs (e.g., shunt EVC 33) may be a mechanically variable VVC, or may be replaced with a variable inductor.

The exemplified matching network 11 has an RF input 13 connected to an RF source 15 and an RF output 17 connected to a plasma chamber 19. An RF input sensor 21 can be connected between the RF impedance matching network 11 and the RF source 15. An RF output sensor 49 can be connected between the RF impedance matching network 11 and the plasma chamber 19 so that the RF output from the impedance matching network, and the plasma impedance presented by the plasma chamber 19, may be monitored. Certain embodiments may include only one of the input sensor 21 and the output sensor 49. The functioning of these sensors 21, 49 are described in greater detail below.

As discussed above, the RF impedance matching network 11 serves to help maximize the amount of RF power transferred from the RF source 15 to the plasma chamber 19 by matching the impedance at the RF input 13 to the fixed impedance of the RF source 15. The matching network 11 can consist of a single module within a single housing designed for electrical connection to the RF source 15 and plasma chamber 19. In other embodiments, the components of the matching network 11 can be located in different housings, some components can be outside of the housing, and/or some components can share a housing with a component outside the matching network.

As is known in the art, the plasma within a plasma chamber 19 typically undergoes certain fluctuations outside of operational control so that the impedance presented by the plasma chamber 19 is a variable impedance. Since the variable impedance of the plasma chamber 19 cannot be fully controlled, an impedance matching network may be used to create an impedance match between the plasma chamber 19 and the RF source 15. Moreover, the impedance of the RF source 15 may be fixed at a set value by the design of the particular RF source 15. Although the fixed impedance of an RF source 15 may undergo minor fluctuations during use, due to, for example, temperature or other environmental variations, the impedance of the RF source 15 is still considered a fixed impedance for purposes of impedance matching because the fluctuations do not significantly vary the fixed impedance from the originally set impedance value. Other types of RF source 15 may be designed so that the impedance of the RF source 15 may be set at the time of, or during, use. The impedance of such types of RF sources 15 is still considered fixed because it may be controlled by a user (or at least controlled by a programmable controller) and the set value of the impedance may be known at any time during operation, thus making the set value effectively a fixed impedance.

The RF source 15 may be an RF generator of a type that is well-known in the art, and generates an RF signal at an appropriate frequency and power for the process performed within the plasma chamber 19. The RF source 15 may be electrically connected to the RF input 13 of the RF impedance matching network 11 using a coaxial cable, which for impedance matching purposes would have the same fixed impedance as the RF source 15.

The plasma chamber 19 includes a first electrode 23 and a second electrode 25, and in processes that are well known in the art, the first and second electrodes 23, 25, in conjunction with appropriate control systems (not shown) and the plasma in the plasma chamber, enable one or both of deposition of materials onto a substrate 27 and etching of materials from the substrate 27.

In the exemplified embodiment, the RF impedance matching network 11 includes a series variable capacitor 31, a shunt variable capacitor 33, and a series inductor 35 to form an 'L' type matching network. The shunt variable capacitor 33 is shown shunting to a reference potential, in this case ground 40, between the series variable capacitor 31 and the series inductor 35, and one of skill in the art will recognize that the RF impedance matching network 11 may be configured with the shunt variable capacitor 33 shunting to a reference potential at the RF input 13 or at the RF output 17.

Figure 3:
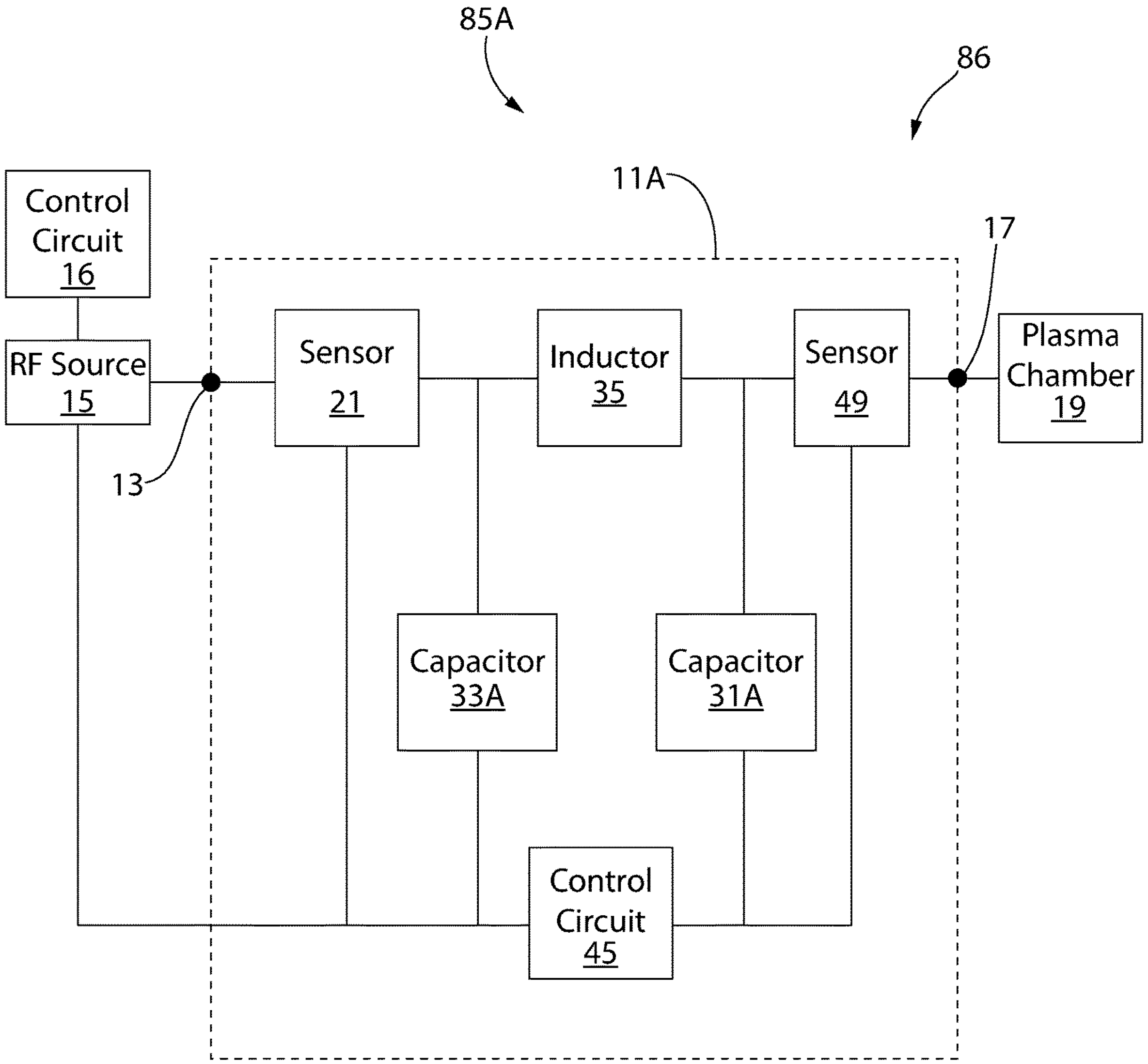
FIG. 3 is a block diagram of an embodiment of a semiconductor processing system having a pi-configuration matching network.

Alternatively, the RF impedance matching network 11 may be configured in other matching network configurations, such as a 'T' type configuration or a 'Π' or 'pi' type configuration, as will be shown in FIG. 3. In certain embodiments, the variable capacitors and the switching circuit described below may be included in any configuration appropriate for an RF impedance matching network.

In the exemplified embodiment, each of the series variable capacitor 31 and the shunt variable capacitor 33 may be an electronic variable capacitor (EVC), as described in U.S. Pat. No. 7,251,121, the EVC being effectively formed as a capacitor array formed by a plurality of discrete capacitors. The series variable capacitor 31 is coupled in series between the RF input 13 and the RF output 17 (which is also in series between the RF source 15 and the plasma chamber 19). The shunt variable capacitor 33 is coupled in parallel between the RF input 13 and ground 40. In other configurations, the shunt variable capacitor 33 may be coupled in parallel between the RF output 19 and ground 40. Other configurations may also be implemented without departing from the functionality of an RF matching network. In still other configurations, the shunt variable capacitor 33 may be coupled in parallel between a reference potential and one of the RF input 13 and the RF output 19.

The series variable capacitor 31 is connected to a series RF choke and filter circuit 37 and to a series driver circuit 39. Similarly, the shunt variable capacitor 33 is connected to a shunt RF choke and filter circuit 41 and to a shunt driver circuit 43. Each of the series and shunt driver circuits 39, 43 are connected to a control circuit 45, which is configured with an appropriate processor and/or signal generating circuitry to provide an input signal for controlling the series and shunt driver circuits 39, 43. A power supply 47 is connected to each of the RF input sensor 21, the series driver circuit 39, the shunt driver circuit 43, and the control circuit 45 to provide operational power, at the designed currents and voltages, to each of these components. The voltage levels provided by the power supply 47, and thus the voltage levels employed by each of the RF input sensor 21, the series driver circuit 39, the shunt driver circuit 43, and the control circuit 45 to perform the respective designated tasks, is a matter of design choice. In other embodiments, a variety of electronic components can be used to enable the control circuit 45 to send instructions to the variable capacitors. Further, while the driver circuit and RF choke and filter are shown as separate from the control circuit 45, these components can also be considered as forming part of the control circuit 45.

In the exemplified embodiment, the control circuit 45 includes a processor. The processor may be any type of properly programmed processing device (or collection of two or more processing devices working together), such as a computer or microprocessor, configured for executing computer program instructions (e.g., code). The processor may be embodied in computer and/or server hardware of any suitable type (e.g., desktop, laptop, notebook, tablets, cellular phones, etc.) and may include all the usual ancillary components necessary to form a functional data processing device including without limitation a bus, software and data storage such as volatile and non-volatile memory, input/output devices, graphical user interfaces (GUIs), removable data storage, and wired and/or wireless communication interface devices including Wi-Fi, Bluetooth, LAN, etc. The processor of the exemplified embodiment is configured with specific algorithms to enable matching network to perform the functions described herein.

With the combination of the series variable capacitor 31 and the shunt variable capacitor 33, the combined impedances of the RF impedance matching network 11 and the plasma chamber 19 may be controlled, using the control circuit 45, the series driver circuit 39, the shunt driver circuit 43, to match, or at least to substantially match, the fixed impedance of the RF source 15.

The control circuit 45 is the brains of the RF impedance matching network 11, as it receives multiple inputs, from sources such as the RF input sensor 21 and the series and shunt variable capacitors 31, 33, makes the calculations necessary to determine changes to the series and shunt variable capacitors 31, 33, and delivers commands to the series and shunt variable capacitors 31, 33 to create the impedance match. The control circuit 45 is of the type of control circuit that is commonly used in semiconductor fabrication processes, and therefore known to those of skill in the art. Any differences in the control circuit 45, as compared to control circuits of the prior art, arise in programming differences to account for the speeds at which the RF impedance matching network 11 is able to perform switching the variable capacitors 31, 33 and impedance matching.

Each of the series and shunt RF choke and filter circuits 37, 41 are configured so that DC signals may pass between the series and shunt driver circuits 39, 43 and the respective series and shunt variable capacitors 31, 33, while at the same time the RF signal from the RF source 15 is blocked to prevent the RF signal from leaking into the outputs of the series and shunt driver circuits 39, 43 and the output of the control circuit 45. The series and shunt RF choke and filter circuits 37, 41 are of a type known to those of skill in the art.

FIG. 3 is a block diagram of an embodiment of a semiconductor processing system 85A having a pi-configuration matching network 11A, as opposed to the L-configuration matching network of FIG. 2. For ease of understanding, this figure omits the RF chokes and filters, driver circuits, and power supplies of FIG. 2. Where FIG. 3 uses reference numbers identical to those of FIG. 2, it is understood that the relevant components can have features similar to those discussed with regard to FIG. 2.

The most significant difference between the L- and pi-configuration is that the L-configuration utilizes a series capacitor 31 and shunt capacitor 33, while the pi-configuration utilizes two shunt capacitors 31A, 33A. Nevertheless, the control circuit can alter the capacitance of these shunt variable capacitors 31A, 33A to cause an impedance match. Each of these shunt variable capacitors 31A, 33A can be an EVC, as discussed above. They can be controlled by a choke, filter, and driver similar to the methods discussed above with respect to FIG. 2.

EVC Capacitor Arrays

Figure 4:
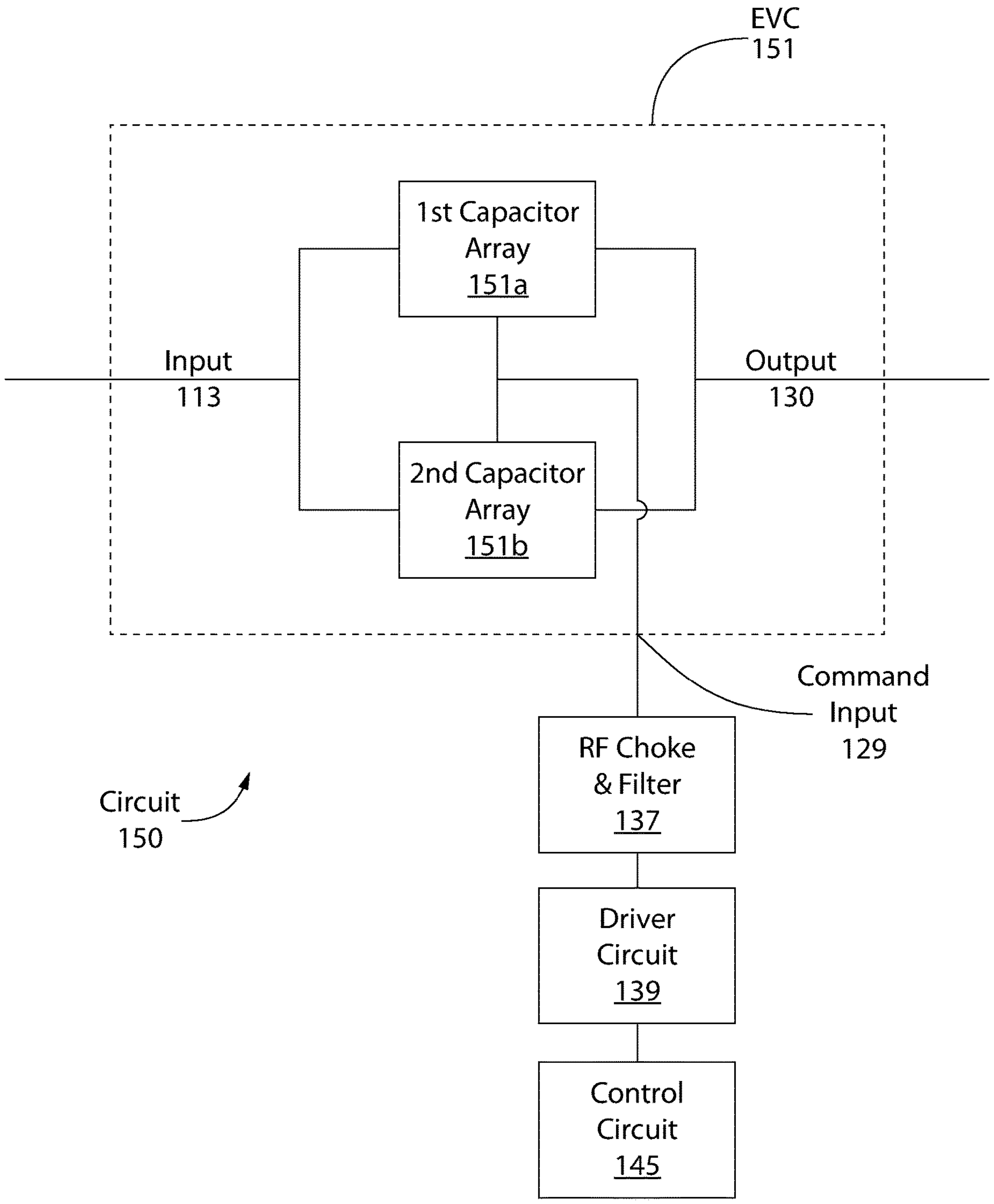
FIG. 4 is a block diagram of an embodiment of a circuit for providing a variable capacitance using an electronically variable capacitor.

FIG. 4 is a block diagram for an embodiment of an electronic circuit 150 for providing a variable capacitance using an electronically variable capacitor 151. The circuit 150 utilizes an EVC 151 that includes two capacitor arrays 151*a*, 151*b*. The exemplified first capacitor array 151*a* has a first plurality of discrete fixed capacitors, each having a first capacitance value. The second capacitor array 151*b* has a second plurality of discrete fixed capacitors, each having a second capacitance value. The first capacitance value is different from the second capacitance value such that the EVC 151 can provide coarse and fine control of the capacitance produced by the EVC 151. The first capacitor array and the second capacitor array are coupled in parallel between a signal input 113 and a signal output 130.

The first and second capacitance values can be any values sufficient to provide the desired overall capacitance values for the EVC 151. In one embodiment, the second capacitance value is less than or equal to one-half (½) of the first capacitance value. In another embodiment, the second capacitance value is less than or equal to one-third (⅓) of the first capacitance value. In yet another embodiment, the second capacitance value is less than or equal to one-fourth (¼) of the first capacitance value.

The electronic circuit 150 further includes a control circuit 145, which can have features similar to control circuit 45 discussed above. The control circuit 145 is operably coupled to the first capacitor array 151*a* and to the second capacitor array 151*b* by a command input 129, the command input 129 being operably coupled to the first capacitor array 151*a* and to the second capacitor array 151*b*. In the exemplified embodiment, the command input 129 has a direct electrical connection to the capacitor arrays 151a, 151*b*, though in other embodiments this connection can be indirect. The coupling of the control circuit 145 to the capacitor arrays 151*a*, 151*b* will be discussed in further detail below.

The control circuit 145 is configured to alter the variable capacitance of the EVC 151 by controlling on and off states of (a) each discrete fixed capacitor of the first plurality of discrete fixed capacitors and (b) each discrete fixed capacitor of the second plurality of discrete fixed capacitors. As stated above, the control circuit 145 can have features similar to those described with respect to control circuit 45 of the preceding figures. For example, the control circuit 145 can receive inputs from the capacitor arrays 151*a*, 151*b*, make calculations to determine changes to capacitor arrays 151*a*, 151*b*, and deliver commands to the capacitor arrays 151*a*, 151*b* for altering the capacitance of the EVC 151. EVC 151 of FIG. 4 can include a plurality of electronic switches. Each electronic switch can be configured to activate and deactivate one or more discrete capacitors.

As with the control circuit 45 of the preceding figures, the control circuit 145 can also be connected to a driver circuit 139 and an RF choke and filter circuit 137. The control circuit 145, driver circuit 139, and RF choke and filter circuit 137 can have capabilities similar to those discussed with regard to the preceding figures. In the exemplified embodiment, the driver circuit 139 is operatively coupled between the control circuit 145 and the first and second capacitor arrays 151*a*, 151*b*. The driver circuit 139 is configured to alter the variable capacitance based upon a control signal received from the control circuit 145. The RF filter 137 is operatively coupled between the driver circuit 139 and the first and second capacitor arrays 151*a*, 151*b*. In response to the control signal sent by the control unit 145, the driver circuit 139 and RF filter 137 are configured to send a command signal to the command input 129. The command signal is configured to alter the variable capacitance by instructing at least one of the electronic switches to activate or deactivate (a) at least one of the discrete capacitors of the first plurality of discrete capacitors or (b) at least one of the discrete capacitors of the second plurality of discrete capacitors.

In the exemplified embodiment, the driver circuit 139 is configured to switch a high voltage source on or off in less than 15 μsec, the high voltage source controlling the electronic switches of each of the first and second capacitor arrays for purposes of altering the variable capacitance. The EVC 151, however, can be switched by any of the means or speeds discussed in the present application.

The control circuit 145 can be configured to calculate coarse and fine capacitance values to be provided by the respective capacitor arrays 151*a*, 151*b*. In the exemplified embodiment, the control circuit 145 is configured to calculate a coarse capacitance value to be provided by controlling the on and off states of the first capacitor array 151*a*. Further, the control circuit is configured to calculate a fine capacitance value to be provided by controlling the on and off states of the second capacitor array 151*b*. In other embodiments, the capacitor arrays 151*a*, 151*b* can provide alternative levels of capacitance. In other embodiments, the EVC can utilize additional capacitor arrays.

EVC 151 of FIG. 4 can be used in a variety of systems requiring a varying capacitance. For example, EVC 151 can be used as the series EVC and/or shunt EVC in an L matching network, or as one or both of the shunt EVCs in a pi matching network. It is often desired that the differences between the capacitance values allow for both a sufficiently fine resolution of the overall capacitance of the circuit and a wide range of capacitance values to enable a better impedance match at the input of a RF matching network, and EVC 151 allows this.

Switching in and Out Discrete Capacitors to Vary EVC Capacitance

As discussed above, an EVC is a type of variable capacitor that can use multiple switches, each used to create an open or short circuit, with individual series capacitors to change the capacitance of the variable capacitor. The switches can be mechanical (such as relays) or solid state (such as PIN diodes, transistors, or other switching devices). The following is a discussion of methods for setting up an EVC or other variable capacitor to provide varying capacitances.

In what is sometimes referred to as an "accumulative setup" of an EVC or other variable capacitor, the approach to linearly increase the capacitor value from the minimum starting point (where all switches are open) is to incrementally increase the number of fine tune capacitors that are switched into the circuit. Once the maximum number of fine tune capacitors is switched into circuit, a coarse tune capacitor is switched in, and the fine tune capacitors are switched out. The process starts over with increasing the number of fine tune capacitors that are switched into circuit, until all fine and coarse tune capacitors are switched in, at which point another coarse tune capacitor is switched in and the fine tune capacitors are switched out. This process can continue until all the coarse and fine capacitors are switched in.

In this embodiment, all of the fine tune capacitors have the same or a substantially similar value, and all the coarse tune capacitors have the same or a substantially similar value. Further, the capacitance value of one coarse tune capacitor about equals the combined capacitance value of all fine tune capacitors plus an additional fine tune capacitor into the circuit, thus enabling a linear increase in capacitance. The embodiments, however, are not so limited. The fine tune capacitors (and coarse capacitors) need not have the same or a substantially similar value. Further, the capacitance value of one coarse tune capacitor need not equal the combined capacitance value of all fine tune capacitors plus an additional fine tune capacitor. In one embodiment, the coarse capacitance value and the fine capacitance value have a ratio substantially similar to 10:1. In another embodiment, the second capacitance value is less than or equal to one-half (½) of the first capacitance value. In another embodiment, the second capacitance value is less than or equal to one-third (⅓) of the first capacitance value. In yet another embodiment, the second capacitance value is less than or equal to one-fourth (¼) of the first capacitance value.

An example of the aforementioned embodiment in an ideal setting would be if the fine tune capacitors were equal to 1 pF, and the coarse tune capacitors were equal to 10 pF. In this ideal setup, when all switches are open, the capacitance is equal to 0 pF. When the first switch is closed, there is 1 pF in the circuit. When the second switch is closed there is 2 pF in the circuit, and so on, until nine fine tune switches are closed, giving 9 pF. Then, the first 10 pF capacitor is switched into circuit and the nine fine tune switches are opened, giving a total capacitance of 10 pF. The fine tune capacitors are then switched into circuit from 11 pF to 19 pF. Another coarse tune capacitor can then be switched into circuit and all fine tune capacitors can be switched out of circuit giving 20 pF. This process can be repeated until the desired capacitance is reached.

This can also be taken one step further. Using the previous example, having nine 1 pF capacitors and also nine 10 pF capacitors, the variable capacitor circuit can have even larger values, 100 pF, to switch in and out of the circuit. This would allow the previous capacitor array to go up to 99 pF, and then the 100 pF capacitor can be used for the next increment. This can be repeated further using larger increments, and can also be used with any counting system. According to the accumulative setup, increasing the total capacitance of a variable capacitor is achieved by switching in more of the coarse capacitors or more of the fine capacitors than are already switched in without switching out a coarse capacitor that is already switched in. Further, when the variable total capacitance is increased and the control circuit does not switch in more of the coarse capacitors than are already switched in, then the control circuit switches in more fine capacitors than are already switched in without switching out a fine capacitor that is already switched in. U.S. Pat. Nos. 10,431,428 and 11,195,698 regarding accumulative setup are incorporated herein by reference in their entirety. It is noted that the claimed invention is not limited to use of the accumulative setup. For example, U.S. Pat. Nos. 10,679,824 and 10,692,699, incorporated herein by reference in their entirety, discuss alternative setups, such as "partial binary."

Figure 5:
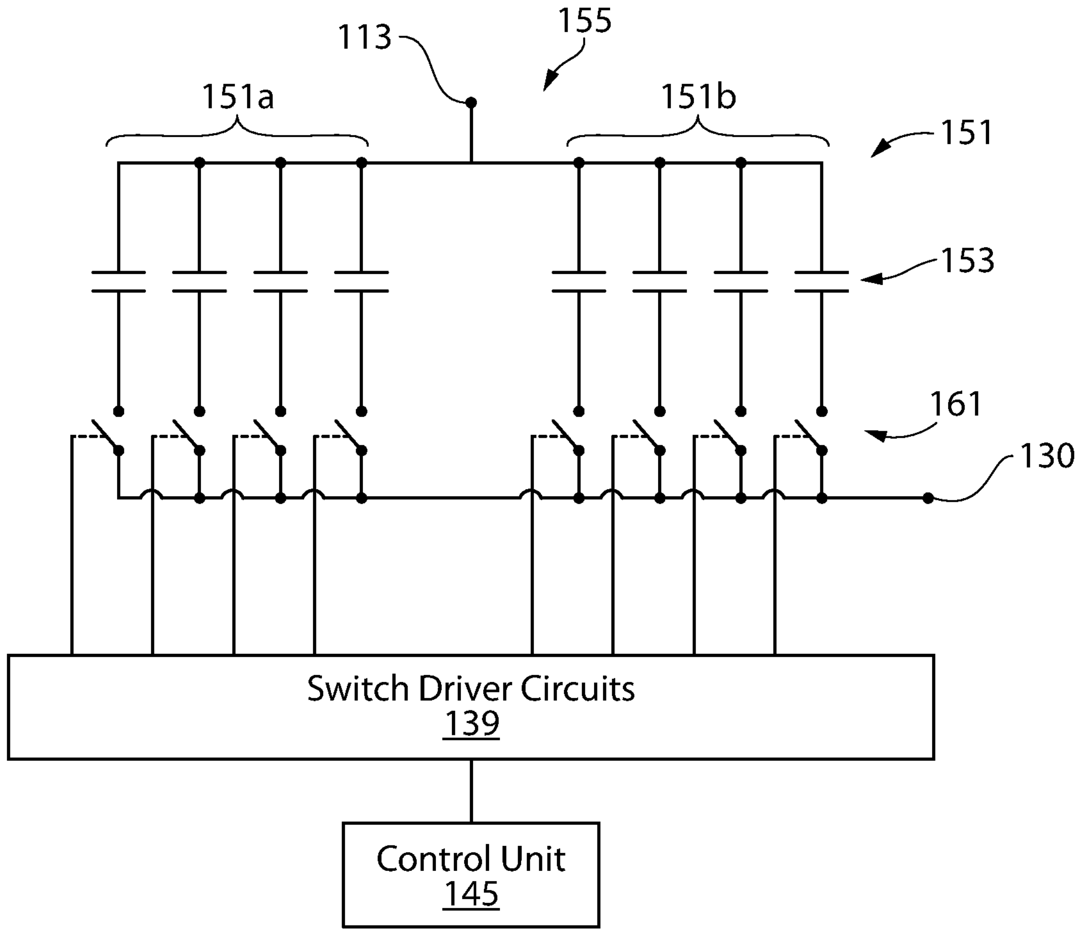
FIG. 5 is a schematic of a variable capacitance system for switching in and out discrete capacitors of an electronically variable capacitor.

FIG. 5 is a schematic of a variable capacitance system 155 for switching in and out discrete fixed capacitors of an electronically variable capacitor. Where this figure uses reference numbers similar to those of FIG. 4, it is understood that the relevant components can have features similar to those discussed in FIG. 4. The variable capacitance system 155 comprises a variable capacitor 151 for providing a varying capacitance. The variable capacitor 151 has an input 113 and an output 130. The variable capacitor 151 includes a plurality of discrete fixed capacitors 153 operably coupled in parallel. The plurality of capacitors 153 includes first (fine) capacitors 151*a* and second (coarse) capacitors 151B. Further, the variable capacitor 151 includes a plurality of switches 161. Of the switches 161, one switch is operably coupled in series to each of the plurality of capacitors to switch in and out each capacitor, thereby enabling the variable capacitor 151 to provide varying total capacitances. The variable capacitor 151 has a variable total capacitance that is increased when discrete capacitors 153 are switched in and decreased when the discrete capacitors 153 are switched out.

The switches 161 can be coupled to switch driver circuits 139 for driving the switches on and off. The variable capacitance system 155 can further include a control unit 145 operably coupled to the variable capacitor 151. Specifically, the control unit 145 can be operably coupled to the driver circuits 139 for instructing the driver circuits 139 to switch one or more of the switches 161, and thereby turn one or more of the capacitors 153 on or off. In one embodiment, the control unit 145 can form part of a control unit that controls a variable capacitor, such as a control unit that instructs the variable capacitors of a matching network to change capacitances to achieve an impedance match. The driver circuits 139 and control unit 145 can have features similar to those discussed above with reference to FIG. 4, and thus can also utilize an RF choke and filter as discussed above.

Switching Circuit for Electronically Variable Capacitor

Figure 6:
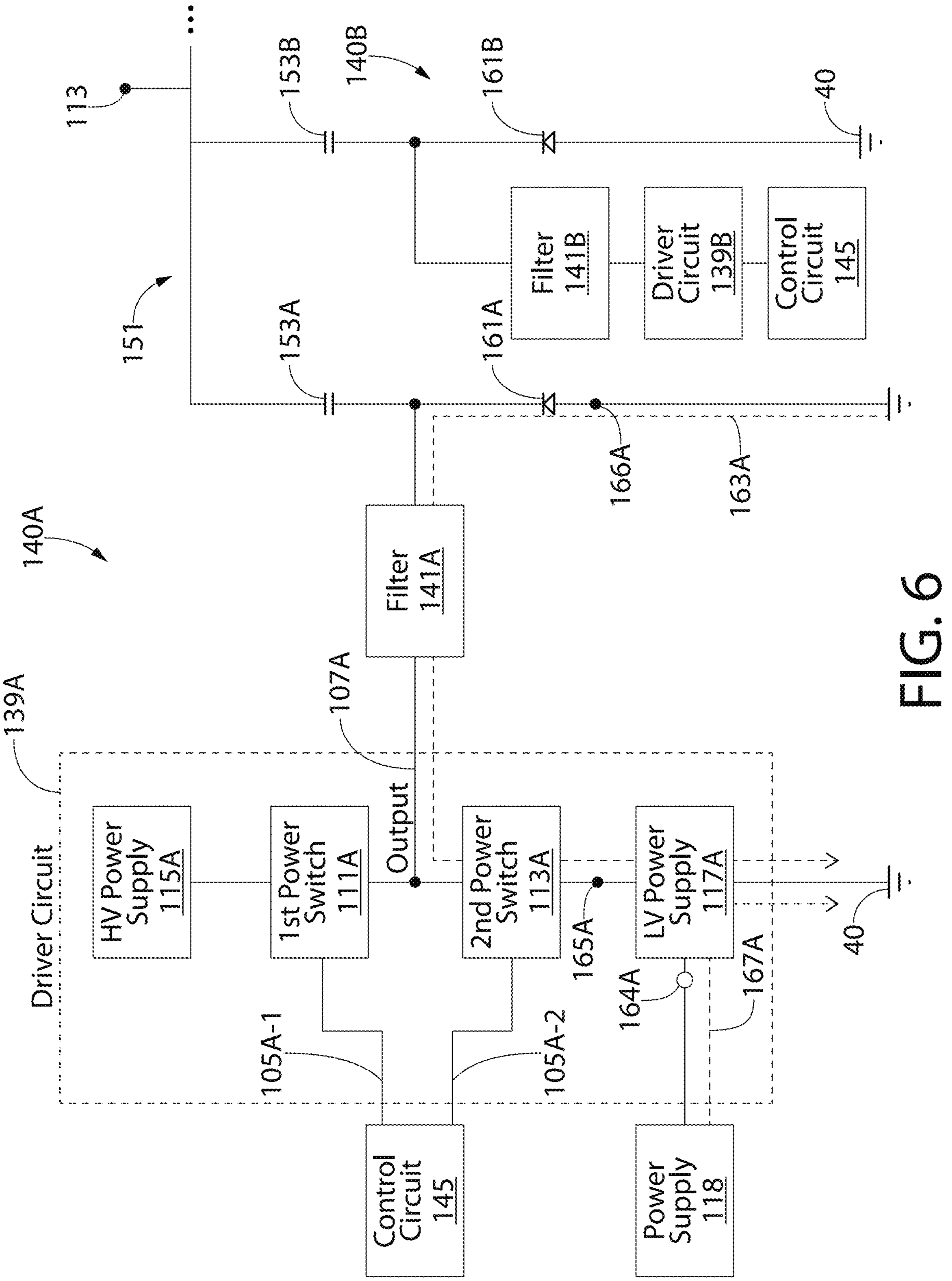
FIG. 6 is a block diagram of an embodiment of a switching circuit for an EVC.

FIG. 6 shows an embodiment of a switching circuit 140A for an EVC 151 of a matching network according to one embodiment. In the exemplified embodiment, the EVC 151 is the EVC 151 of FIG. 5, but the EVC of the invention is not so limited, as it can have any of the alternative features discussed herein, including a different number of discrete fixed capacitors 153, and discrete fixed capacitors of different values than those discussed with respect to FIG. 5. Further, the EVC can form part of any type of matching network, including the various types of matching networks discussed herein. The exemplified matching network is coupled between an RF source and a plasma chamber, as shown, for example, in the preceding figures.

The exemplified EVC comprises a plurality of discrete fixed capacitors 153A, 153B coupled to a first terminal 113. Each discrete capacitor 153A, 153B has a corresponding switch 161A, 161B configured to switch in (or "ON") the discrete capacitor and switch out (or "OFF") the discrete capacitor to alter a total capacitance of the EVC 151. In the exemplified embodiment, the switch 161A is in series with the discrete capacitor 153A, but the invention is not so limited. Further, in the exemplified embodiment, the switch 161A is a PIN diode, but the invention is not so limited, and may be another type of switch, such as a NIP diode. In yet other embodiments, the switch may be a MOSFET, a JFET, or another type of switch. Further, in the exemplified embodiment, the PIN diode has a common anode configuration such that the anode of each PIN diode 161A, 161B is coupled to a ground 40, which may be any common node. The invention is not so limited, however, since in other embodiments the EVC may use a common cathode configuration such that the cathode of each PIN diode is coupled to the ground 40 (and the components of the driver circuit are altered accordingly). Further, it is noted that two or more switches may be used in series to increase the voltage rating and/or two or more switches may be used in parallel to increase the current rating of the channel.

Each PIN diode switch 161A, 161B has its own switching circuit 140A, 140B, which is connected to a control circuit 145. Switching circuit 140B is shown as including switch 161B, filter 141B (which may be similar to the filter circuits 37, 41 discussed above), and driver circuit 139B. The filter 141B can be, for example, an LC circuit similar to filter circuit 9 of U.S. Pat. No. 10,340,879, or the filter circuit beside output 207 in FIG. 6A of U.S. Pat. No. 9,844,127. Each of these patents is incorporated herein by reference in its entirety.

Exemplified switching circuit 140A has the same components as switching circuit 140B, but shows the driver circuit 139A in greater detail. The driver circuit 139A may be integrated with the PIN diode 161A (or other type of switch), or may be integrated with the discrete fixed capacitors of the EVC of the matching network. One of skill in the art will also recognize that certain components of the driver circuit 139A may be replaced with other components that perform the same essential function while also allowing greater variability in other circuit parameters (e.g., voltage range, current range, and the like).

The exemplified driver circuit 139A has two inputs 105A-1, 105A-2 for receiving control signals from the control circuit for controlling the voltage on the common output 107A that is connected to and drives the PIN diode 161A. The voltage on the common output 107A switches the PIN diode 161A between the ON state and the OFF state, thus also switching in/ON and out/OFF the discrete capacitor 153A to which the PIN diode 161A is connected. The state of the discrete capacitor, in this exemplary embodiment, follows the state of the corresponding PIN diode, such that when the PIN diode is ON, the discrete capacitor is also in/ON, and likewise, when the PIN diode 161A is OFF, the discrete capacitor is also out/OFF. Thus, statements herein about the state of the PIN diode 161A inherently describe the concomitant state of the corresponding discrete capacitor 153A of the EVC 151.

In a preferred embodiment, each of the first power switch 111A and the second power switch 113A is a MOSFET with a body diode, though in other embodiments either of the power switches can be another type of switch, including any other type of semiconductor switch. The invention may utilize a variety of switching circuit configurations. For example, the invention may utilize any of the switching circuits disclosed by U.S. Pat. No. 9,844,127, such as those shown in FIGS. 3, 6A, 6B, and any of the switching circuits disclosed by U.S. Pat. No. 10,340,879, such as the switching circuit shown at FIG. 18. As stated above, each of these patents is incorporated herein by reference in its entirety.

In the exemplified embodiment, a high voltage power supply 115A is connected to the first power switch 111A, providing a high voltage input which is to be switchably connected to the common output 107A. A low voltage power supply 117A is connected to the second power switch 113A, providing a low voltage input which is also to be switchably connected to the common output 107A. In the configuration of the driver circuit 139A shown, the low voltage power supply 117A may supply a low voltage input which is about −3.3V. Such a low voltage, with a negative polarity, is sufficient to provide a forward bias for switching the PIN diode 161A. For other configurations of the driver circuit 139A, a higher or lower voltage input may be used, and the low voltage input may have a positive polarity, depending upon the configuration and the type of electronic switch being controlled.

In the exemplified switching circuit 140A, the first power switch 111A and the second power switch 113A are configured to asynchronously connect the high-voltage power supply 115A and the low voltage power supply 117A to the common output 107A for purposes of switching the PIN diode 161A between the ON state and the OFF state, and thereby switching the corresponding discrete fixed capacitor 153A in and out. The high-voltage power supply 115A provides a reverse-biasing DC voltage for the PIN diode switch 161A. This may be referred to as a "blocking voltage" as it reverse-biases the PIN diode 161A and thus prevents current from flowing, thus switching out its corresponding discrete capacitor 153A. As used herein, the term "blocking voltage" will refer to any voltage used to cause a switch to switch out or in its corresponding discrete capacitor. It is further noted that the switching circuit is not limited to that shown in FIG. 6, but may be any circuit for switching in and out discrete capacitors, including those shown in U.S. Pat. No. 9,844,127, which is incorporated herein by reference in its entirety.

In the exemplified embodiment, the control circuit provides separate control signals to separate inputs 105A-1, 105A-2 of the driver circuit 139A. In this embodiment, the separate inputs 105A-1, 105A-2 are coupled to the first and second power switches 111A, 113A, respectively. The control signals to the separate inputs may be opposite in polarity. In a preferred embodiment, the first and second power switches 161A, 113A are MOSFETS, and the separate control signals go to separate drivers for powering the MOSFETs. In an alternative embodiment, the control circuit 145 provides a common input signal. The common input signal may asynchronously control the ON and OFF states of the first power switch 111A and the second power switch 113A, such that when the first power switch 111A is in the ON state, the second power switch 113A is in the OFF state, and similarly, when the first power switch is in the OFF state, the second power switch 113A is in the ON state. In this manner, the common input signal controls the first power switch 111A and the second power switch 113A to asynchronously connect the high voltage input and the low voltage input to the common output for purposes of switching the PIN diode 161A between the ON state and the OFF state. The invention, however, not limited to such asynchronous control.

The inputs 105A-1, 105A-2 may be configured to receive any type of appropriate control signal for the types of switches selected for the first power switch 111A and the second power switch 113A, which may be, for example, a +15 V control signal. In a preferred embodiment, the driver circuit has a separate driver for driving each of the first power switch 111A and second power switch 112A. In another embodiment, the first and second power switches 111A, 113A are selected so that they may receive a common input signal.

In the exemplified embodiment, a power supply 118 is coupled to an input of the low voltage power supply 117A. In a preferred embodiment, the power supply 118 provides 24 VDC. The invention, however, is not so limited, as other power supplies may be utilized.

In the exemplified embodiment, when the second power switch 113A is ON, a current 163A flows between the PIN diode 161A and the low voltage power supply 117A. At the same time, current flows from the power supply 118 to the input of low voltage power supply 117A, and to the ground 40. A sensor may be positioned at a node of the switching circuit 140A to measure a parameter associated with the current 163A flowing between the low voltage power supply 117A and the PIN diode switch 161A. In the exemplified embodiment, sensor 164A is positioned at an input of the low voltage power supply 117A, and measures the current 167A flowing into the input from the power supply 118, which is related to current 163A. In other embodiments, the sensor can be at other positions in the switching circuit 140A, such as at node 165A (the output of the low voltage power supply) or node 166A (the anode of PIN diode 161A) or in the path of the filter 141A between the driver circuit and the switch (e.g., driver output 107A or the output of filter 141A). In the exemplified embodiment, the parameter is the value of the current flowing at the node, but in other embodiments the parameter measured may be any parameter (including voltage) associated with current flowing through the switch or switches. In yet other embodiments, the parameter is any parameter associated with the driver circuit.

It is noted that the matching networks discussed herein may incorporate biasing circuits, such as those discussed in PCT/US22/23395, filed Apr. 5, 2022, which is incorporated herein by reference in its entirety. For example, a biasing inductor of the biasing circuit may be used in switching the fixed discrete capacitors of an EVC in the series position, this EVC not being grounded.

Determining Capacitance Values to Achieve Match

Figure 7:
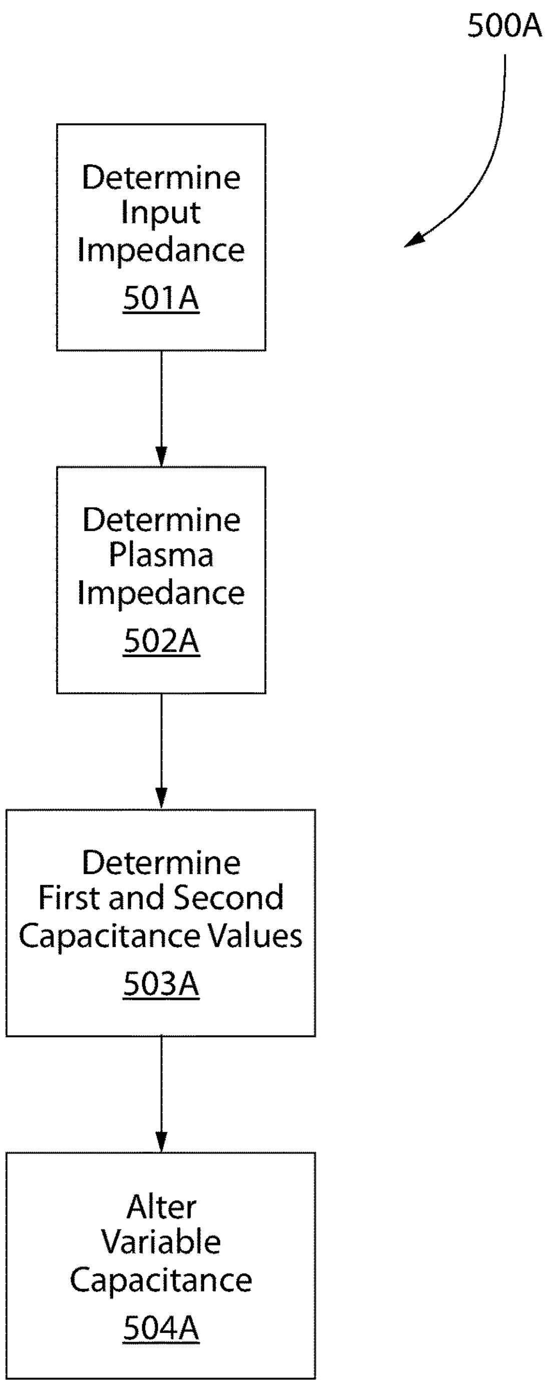
FIG. 7 is a flow chart of an exemplary process for matching an impedance by altering a variable capacitance.

FIG. 7 is a flow chart showing a process 500A for matching an impedance according to one embodiment. The matching network can include components similar to those discussed above. In one embodiment, the matching network of FIG. 3 is utilized. In the first step of the exemplified process 500A of FIG. 7, an input impedance at the RF input 13 is determined (step 501A). The input impedance is based on the RF input parameter detected by the RF input sensor 21 at the RF input 13. The RF input sensor 21 can be any sensor configured to detect an RF input parameter at the RF input 13. The input parameter can be any parameter measurable at the RF input 13, including a voltage, a current, or a phase at the RF input 13. In the exemplified embodiment, the RF input sensor 21 detects the voltage, current, and phase at the RF input 13 of the matching network 11. Based on the RF input parameter detected by the RF input sensor 21, the control circuit 45 determines the input impedance.

Next, the control circuit 45 determines the plasma impedance presented by the plasma chamber 19 (step 502A). In one embodiment, the plasma impedance determination is based on the input impedance (determined in step 501A), the capacitance of the series EVC 31, and the capacitance of the shunt EVC 33. In other embodiments, the plasma impedance determination can be made using the output sensor 49 operably coupled to the RF output, the RF output sensor 49 configured to detect an RF output parameter. The RF output parameter can be any parameter measurable at the RF output 17, including a voltage, a current, or a phase at the RF output 17. The RF output sensor 49 may detect the output parameter at the RF output 17 of the matching network 11. Based on the RF output parameter detected by the RF output sensor 21, the control circuit 45 may determine the plasma impedance. In yet other embodiments, the plasma impedance determination can be based on both the RF output parameter and the RF input parameter.

Once the variable impedance of the plasma chamber 19 is known, the control circuit 45 can determine the changes to make to the variable capacitances of one or both of the series and shunt EVCs 31, 33 for purposes of achieving an impedance match. Specifically, the control circuit 45 determines a first capacitance value for the series variable capacitance and a second capacitance value for the shunt variable capacitance (step 503A). These values represent the new capacitance values for the series EVC 31 and shunt EVC 33 to enable an impedance match, or at least a substantial impedance match. In the exemplified embodiment, the determination of the first and second capacitance values is based on the variable plasma impedance (determined in step 502A) and the fixed RF source impedance.

Once the first and second capacitance values are determined, the control circuit 45 generates a control signal to alter at least one of the series variable capacitance and the shunt variable capacitance to the first capacitance value and the second capacitance value, respectively (step 504A). This is done at approximately t=−5 μsec. The control signal instructs the switching circuit to alter the variable capacitance of one or both of the series and shunt EVCs 31, 33.

In the exemplified embodiment, the EVCs are altered while the RF source continues to provide the RF signal to the RF input to the matching network. There is no need to stop the provision of the RF signal before altering the EVCs. The determination of new capacitance values and the alteration of the EVCs can be done continuously (and repeatedly) while the RF signal continues to be provided to the matching network.

The alteration of the EVCs 31, 33 takes about 9-11 μsec total, as compared to about 1-2 sec of time for an RF matching network using VVCs. Once the switch to the different variable capacitances is complete, there is a period of latency as the additional discrete capacitors that make up the EVCs join the circuit and charge. This part of the match tune process takes about 55 μsec. Finally, the RF power profile 403 is shown decreasing, at just before t=56 μsec, from about 380 mV peak-to-peak to about 100 mV peak-to-peak. This decrease in the RF power profile 403 represents the decrease in the reflected power 407, and it takes place over a time period of about 10 μsec, at which point the match tune process is considered complete.

The altering of the series variable capacitance and the shunt variable capacitance can comprise sending a control signal to the series driver circuit 39 and the shunt driver circuit 43 to control the series variable capacitance and the shunt variable capacitance, respectively, where the series driver circuit 39 is operatively coupled to the series EVC 31, and the shunt driver circuit 43 is operatively coupled to the shunt EVC 43. When the EVCs 31, 33 are switched to their desired capacitance values, the input impedance may match the fixed RF source impedance (e.g., 50 Ohms), thus resulting in an impedance match. If, due to fluctuations in the plasma impedance, a sufficient impedance match does not result, the process of 500A may be repeated one or more times to achieve an impedance match, or at least a substantial impedance match.

Using an RF matching network 11, such as that shown in FIG. 3, the input impedance can be represented as follows:

$$Z_{in} = \frac{(Z_P + Z_L + Z_{series})Z_{shunt}}{Z_P + Z_L + Z_{series} + Z_{shun}}$$

where $Z_{in}$ is the input impedance, $Z_P$ is the plasma impedance, $Z_L$ is the series inductor impedance, $Z_{series}$ is the series EVC impedance, and $Z_{shunt}$ is the shunt EVC impedance. In the exemplified embodiment, the input impedance ($Z_{in}$) is determined using the RF input sensor 21. The EVC impedances ($Z_{series}$ and $Z_{shunt}$) are known at any given time by the control circuitry, since the control circuitry is used to command the various discrete fixed capacitors of each of the series and shunt EVCs to turn ON or OFF. Further, the series inductor impedance ($Z_L$) is a fixed value. Thus, the system can use these values to solve for the plasma impedance ($Z_P$).

Based on this determined plasma impedance ($Z_P$) and the known desired input impedance ($Z'_{in}$) (which is typically 50 Ohms), and the known series inductor impedance ($Z_L$), the system can determine a new series EVC impedance ($Z_{series}$) and shunt EVC impedance ($Z_{shunt}$).

$$Z'_{in} = \frac{(Z_P + Z_L + Z'_{series})Z'_{shunt}}{Z_P + Z_L + Z'_{series} + Z'_{shunt}}$$

Based on the newly calculated series EVC variable impedance ($Z'_{series}$) and shunt EVC variable impedance ($Z'_{shunt}$), the system can then determine the new capacitance value (first capacitance value) for the series variable capacitance and a new capacitance value (second capacitance value) for the shunt variable capacitance. When these new capacitance values are used with the series EVC 31 and the shunt EVC 33, respectively, an impedance match may be accomplished.

The exemplified method of computing the desired first and second capacitance values and reaching those values in one step is significantly faster than moving the two EVCs step-by-step to bring either of the error signals to zero, or to bring the reflected power/reflection coefficient to a minimum. In semiconductor plasma processing, where a faster tuning scheme is desired, this approach provides a significant improvement in matching network tune speed. It is noted that methods for determining new EVC capacitance values discussed herein are only examples. In other embodiments, other parameters and/or methods may be used to determine a new EVC capacitance value. For example, the parameter upon which a new capacitance value is based may be any parameter related to the plasma chamber.

Determining Capacitance Values Using Parameter Matrix

Figure 8:
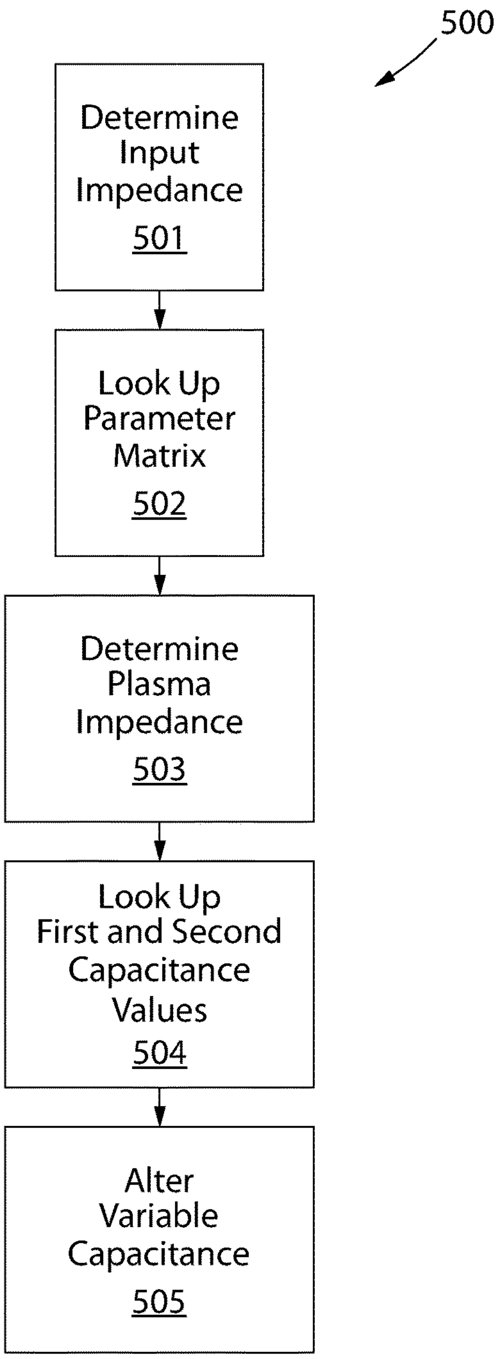
FIG. 8 is a flow chart of an exemplary process for matching an impedance using a parameter matrix to alter a variable capacitance.

FIG. 8 provides an alternative process 500 for matching an impedance that uses a parameter matrix. In the exemplified process, the control circuit 45 (see FIG. 3 for matching network components) is configured and/or programmed to carry out each of the steps. As one of two initial steps, RF parameters are measured at the RF input 13 by the RF input sensor 21, and the input impedance at the RF input 13 is calculated (step 501) using the measured RF parameters. For this exemplified process 500, the forward voltage and the forward current are measured at the RF input 13. In certain other embodiments, the RF parameters may be measured at the RF output 17 by the RF output sensor 49, although in such embodiments, different calculations may be required than those described below. In still other embodiments, RF parameters may be measured at both the RF input 13 and the RF output 17.

The impedance matching circuit, coupled between the RF source 15 and the plasma chamber 19, may be characterized by one of several types of parameter matrices known to those of skill in the art, including two-port parameter matrices. An S-parameter matrix and a Z-parameter matrix are two examples of such parameter matrices. Other examples include, but are not limited to, a Y-parameter matrix, a G-parameter matrix, an H-parameter matrix, a T-parameter matrix, and an ABCD-parameter matrix. Those of skill in the art will recognize also that these various parameter matrices may be mathematically converted from one to the other for an electrical circuit such as a matching network. The second initial step of the exemplified process 500 is to look up (step 502) the parameter matrix for the existing configuration of the impedance matching circuit in a parameter lookup table. The existing configuration of the impedance matching circuit is defined by existing operational parameters of the impedance matching circuit, particularly the existing array configurations for both of the series EVC 31 and the shunt EVC 33. In order to achieve an impedance match, the existing configuration of the impedance matching circuit is altered to a new configuration of the impedance matching circuit as part of the exemplified process 500.

The parameter lookup table includes a plurality of parameter matrices, with each parameter matrix being associated with a particular configuration of the series EVC 31 and the shunt EVC 33. The parameter lookup table may include one or more of the aforementioned types of parameter matrices. In the exemplified process 500, the parameter lookup table includes at least a plurality of S-parameter matrices. In certain embodiments, the parameter lookup table may include at least a plurality of Z-parameter matrices. In embodiments in which the parameter lookup table includes multiple types of parameter matrices, the different types of parameter matrices are associated within the parameter lookup table in such a way so as to eliminate the need for mathematical conversions between the different types of parameter matrices. For example, the T-parameter matrix may be included as part of the parameter lookup table, with each T-parameter matrix associated with the associated S-parameter matrix that would result from conversion between the two matrices.

The input impedance calculation (step 501) and the parameter matrix look up (step 502) may be performed in any order. With the input impedance calculated (step 501) and the parameter matrix for the existing configuration of the impedance matching circuit identified within the parameter lookup table (step 502) done, the plasma or load impedance may then be calculated (step 503) using the calculated input impedance and the parameter matrix for the existing configuration. Next, from the calculated plasma impedance, the match configurations for the series EVC 31 and the shunt EVC 33 that would achieve an impedance match, or at least a substantial impedance match, between the RF source 15 and the plasma chamber 19 are looked up (step 504) in an array configuration lookup table. These match configurations from the array configuration lookup table are the array configurations which will result in new capacitance values for the series EVC 31 and shunt EVC 33, with an impedance match being achieved with the new array configurations and associated new capacitance values. The array configuration lookup table is a table of array configurations for the series EVC 31 and the shunt EVC 33, and it includes each possible array configuration of the series EVC 31 and the shunt EVC 33 when used in combination. As an alternative to using an array configuration lookup table, the actual capacitance values for the EVCs 31, 33 may be calculated during the process-however, such real-time calculations of the capacitance values are inherently slower than looking up the match configurations in the array configuration lookup table. After the match configurations for the series EVC 31 and the shunt EVC 33 are identified in the array configuration lookup table, then one or both of the series array configuration and the shunt array configuration are altered (step 505) to the respective identified match configurations for the series EVC 31 and the shunt EVC 33.

The altering (step 505) of the series array configuration and the shunt array configuration may include the control circuit 45 sending a control signal to the series driver circuit 39 and the shunt driver circuit 43 to control the series array configuration and the shunt array configuration, respectively, where the series driver circuit 39 is operatively coupled to the series EVC 31, and the shunt driver circuit 43 is operatively coupled to the shunt EVC 43. When the EVCs 31, 33 are switched to the match configurations, the input impedance may match the fixed RF source impedance (e.g., 50 Ohms), thus resulting in an impedance match. If, due to fluctuations in the plasma impedance, a sufficient impedance match does not result, the process 500 may be repeated one or more times to achieve an impedance match, or at least a substantial impedance match.

The lookup tables used in the process described above are compiled in advance of the RF matching network being used in conjunction with the plasma chamber 19. In creating the lookup tables, the RF matching network 11 is tested to determine at least one parameter matrix of each type and the load impedance associated with each array configuration of the series EVC 31 and the shunt EVC 33 prior to use with a plasma chamber. The parameter matrices resulting from the testing are compiled into the parameter lookup table so that at least one parameter matrix of each type is associated with a respective array configuration of the EVCs 31, 33. Similarly, the load impedances are compiled into the array configuration lookup table so that each parameter matrix is associated with a respective array configuration of the EVCs 31, 33. The pre-compiled lookup tables may take into consideration the fixed RF source impedance (e.g., 50 Ohms), the power output of the RF source, and the operational frequency of the RF source, among other factors that are relevant to the operation of the RF matching network. Each lookup table may therefore have tens of thousands of entries, or more, to account for all the possible configurations of the EVCs 31, 33. The number of possible configurations is primarily determined by how many discrete fixed capacitors make up each of the EVCs 31, 33. In compiling the lookup tables, consideration may be given to possible safety limitations, such as maximum allowed voltages and currents at critical locations inside the matching network, and this may serve to exclude entries in one or more of the lookup tables for certain configurations of the EVCs 31, 33.

As is known in the art, the S-parameter matrix is composed of components called scatter parameters, or S-parameters for short. An S-parameter matrix for the impedance matching circuit has four S-parameters, namely $S_{11}$, $S_{12}$, $S_{21}$, and $S_{22}$, each of which represents a ratio of voltages at the RF input 13 and the RF output 17. All four of the S-parameters for the impedance matching circuit are determined and/or calculated in advance, so that the full S-parameter matrix is known. The parameters of the other types of parameter matrices may be similarly determined and/or calculated in advance and incorporated into the parameter matrix. For example, a Z-parameter matrix for the impedance matching circuit has four Z-parameters, namely $Z_{11}$, $Z_{12}$, $Z_{21}$, and $Z_{22}$.

By compiling the parameter lookup table in this manner, the entire time cost of certain calculations occurs during the testing phase for the RF matching network, and not during actual use of the RF matching network 11 with a plasma chamber 19. Moreover, because locating a value in a lookup table can take less time than calculating that same value in real time, using the lookup table can aid in reducing the overall time needed to achieve an impedance match. In a plasma deposition or etching process which includes potentially hundreds or thousands of impedance matching adjustments throughout the process, this time savings can help add directly to cost savings for the overall fabrication process.

From the beginning of the match tune process, which starts with the control circuit determining the variable impedance of the plasma chamber and determining the series and shunt match configurations, to the end of the match tune process, when the RF power reflected back toward the RF source decreases, the entire match tune process of the RF impedance matching network using EVCs has an elapsed time of approximately 110 μsec, or on the order of about 150 μsec or less. This short elapsed time period for a single iteration of the match tune process represents a significant increase over a VVC matching network. Moreover, because of this short elapsed time period for a single iteration of the match tune process, the RF impedance matching network using EVCs may iteratively perform the match tune process, repeating the two determining steps and the generating another control signal for further alterations to the array configurations of one or both of the electronically variable capacitors. By iteratively repeating the match tune process, it is anticipated that a better impedance match may be created within about 2-4 iterations of the match tune process. Moreover, depending upon the time it takes for each repetition of the match tune process, it is anticipated that 3-4 iterations may be performed in 500 μsec or less. Given the 1-2 sec match time for a single iteration of a match tune process for RF impedance matching networks using VVCs, this ability to perform multiple iterations in a fraction of the time represents a significant advantage for RF impedance matching networks using EVCs.

Those of skill in the art will recognize that several factors may contribute to the sub-millisecond elapsed time of the impedance matching process for an RF impedance matching network using EVCs. Such factors may include the power of the RF signal, the configuration and design of the EVCs, the type of matching network being used, and the type and configuration of the driver circuit being used. Other factors not listed may also contribute to the overall elapsed time of the impedance matching process. Thus, it is expected that the entire match tune process for an RF impedance matching network having EVCs should take no more than about 500 μsec to complete from the beginning of the process (i.e., measuring by the control circuit and calculating adjustments needed to create the impedance match) to the end of the process (the point in time when the efficiency of RF power coupled into the plasma chamber is increased due to an impedance match and a reduction of the reflected power). Even at a match tune process on the order of 500 μsec, this process time still represents a significant improvement over RF impedance matching networks using VVCs.

Table 1 presents data showing a comparison between operational parameters of one example of an EVC versus one example of a VVC. As can be seen, EVCs present several advantages, in addition to enabling fast switching for an RF impedance matching network:

TABLE 1

| Parameter | EVC | Typical 1000 pF Vacuum Capacitors |
|---|---|---|
| Capacitance | 20 pF~1400 pF | 15 pF~1000 pF |
| Reliability | High | Low |
| Response Time | ~500 μsec | 1 s~2 s |
| ESR | ~13 mW | ~20 mW |
| Voltage | 7 kV | 5 kV |
| Current Handling Capability | 216 A rms | 80 A rms |
| Volume | 4.5 $in^3$ | 75 $in^3$ |

As is seen, in addition to the fast switching capabilities made possible by the EVC, EVCs also introduce a reliability advantage, a current handling advantage, and a size advantage. Additional advantages of the RF impedance matching network using EVCs and/or the switching circuit itself for the EVCs include:

- The disclosed RF impedance matching network does not include any moving parts, so the likelihood of a mechanical failure reduced to that of other entirely electrical circuits which may be used as part of the semiconductor fabrication process. For example, the typical EVC may be formed from a rugged ceramic substrate with copper metallization to form the discrete capacitors. The elimination of moving parts also increases the resistance to breakdown due to thermal fluctuations during use.
- The EVC has a compact size as compared to a VVC, so that the reduced weight and volume may save valuable space within a fabrication facility.
- The design of the EVC introduces an increased ability to customize the RF matching network for specific design needs of a particular application. EVCs may be configured with custom capacitance ranges, one example of which is a non-linear capacitance range. Such custom capacitance ranges can provide better impedance matching for a wider range of processes. As another example, a custom capacitance range may provide more resolution in certain areas of impedance matching. A custom capacitance range may also enable generation of higher ignition voltages for easier plasma strikes.
- The short match tune process (~500 μsec or less) allows the RF impedance matching network to better keep up with plasma changes within the fabrication process, thereby increasing plasma stability and resulting in more controlled power to the fabrication process.
- The use of EVCs, which are digitally controlled, non-mechanical devices, in an RF impedance matching network provides greater opportunity to fine tune control algorithms through programming.
- EVCs exhibit superior low frequency (kHz) performance as compared to VVCs.

Matching with Multi-Level Power Setpoints

In modern semiconductor processes, there are instances where the process requires the RF source to generate a multi-level pulse signal such that the RF signal has cyclically recurring pulse intervals with differing amplitude levels. In some cases, the change in the power setpoint amplitude level can be very frequent and of the order of a few tens of hundreds of microseconds. The multi-level power setpoint can be two levels or more. Such pulsing is sometimes referred to as level-to-level pulsing because the power setpoint goes from one level to another and not just between a level and zero. While such cyclic adjustment of the intensity level of the RF energy used to generate the plasma can provide advantages, it also creates challenges with regard to impedance matching, due to the rapid variations in the load impedance caused by the differing pulse levels.

Typical RF matching networks based on electromechanical components, such as vacuum variable capacitors, cannot move their positions for the short pulses of level-to-level pulsing, and therefore they are set to (or their internal automatic matching algorithms set themselves to) an average position for the electromechanical components setting. This is not an optimal method, since the electromechanical matching network is not tuned to either one level or the other and thus the RF source in the system is exposed to high reflected power for each of the levels.

An RF matching network utilizing solid state technology, which may include the use of EVCs, is able to tune significantly faster, and thus is able to match for each of the power setpoint levels. The methods described below provide methods for performing RF impedance matching when the RF signal has multi-level power setpoints. The methods can be applied to various types of RF matching networks based on solid state technology, including as those matching networks discussed above that utilize one or more EVCs.

Figure 9:
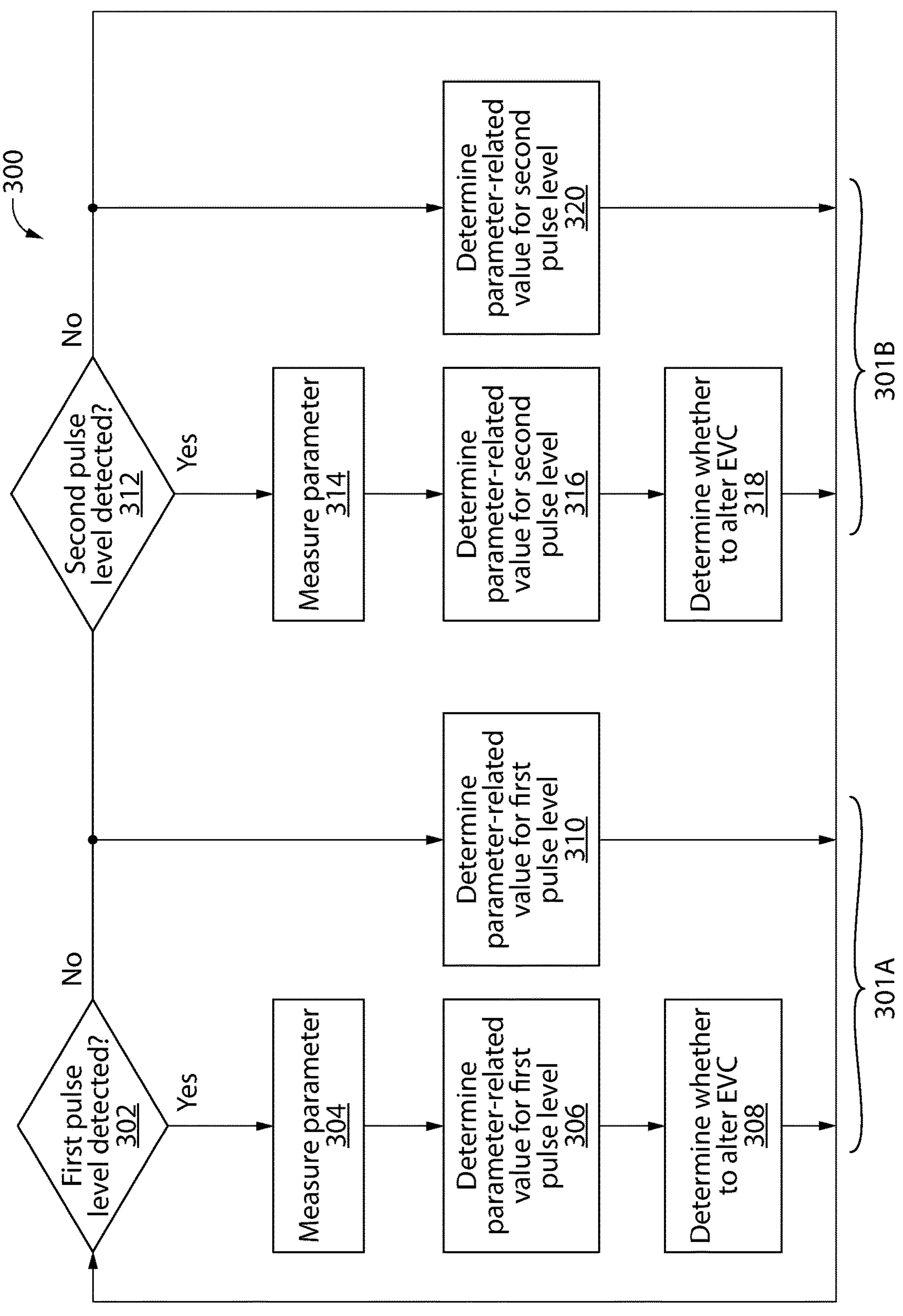
FIG. 9 is flow chart of an embodiment of a process for impedance matching when the RF input signal has multi-level power setpoints according to one embodiment.
Figure 10:
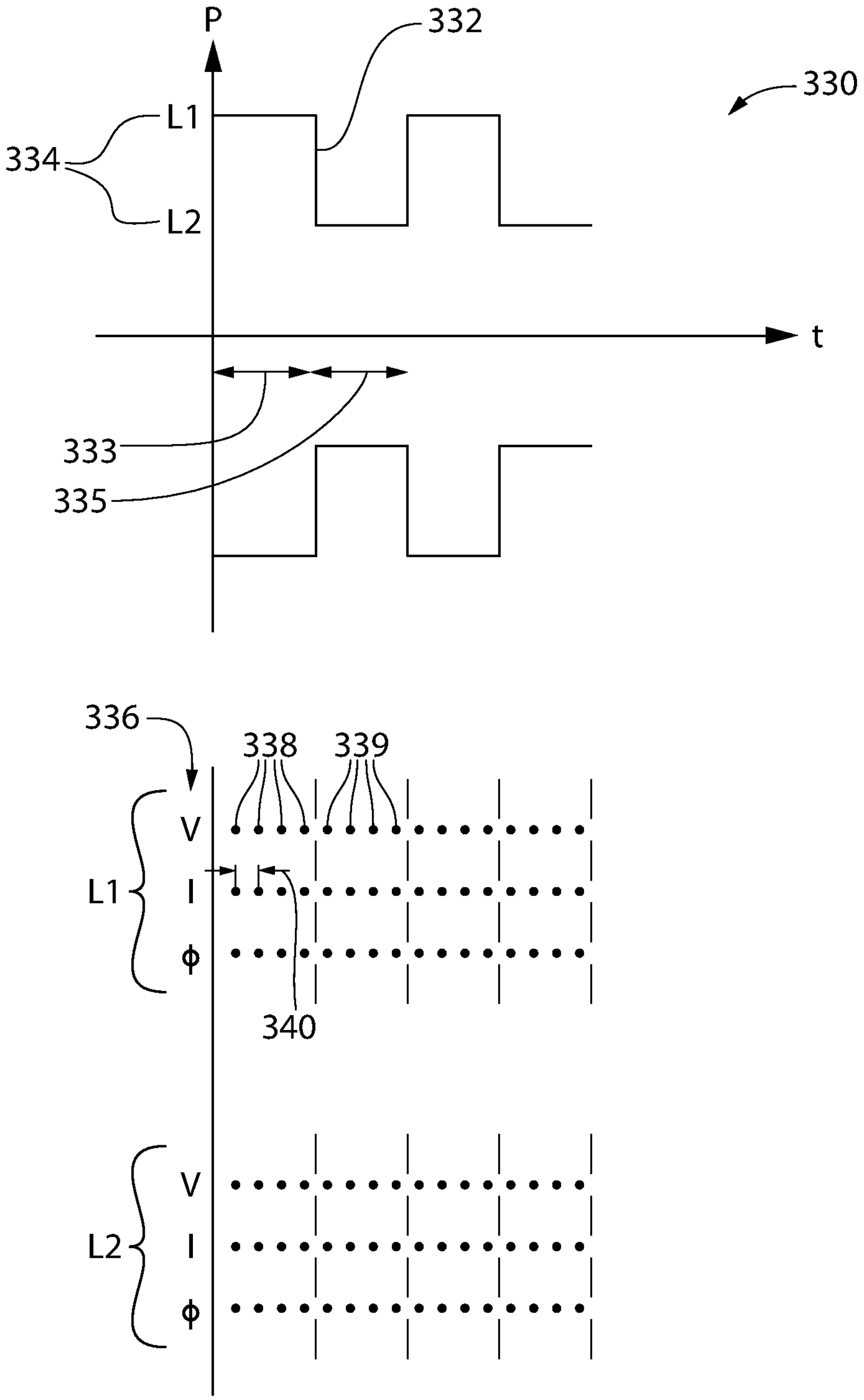
FIG. 10 is a graph showing the pulse levels and timing of parameter-related value determinations according to the embodiment of FIG. 9.

FIGS. 9 and 10 are discussed below to describe an embodiment for performing level-to-level pulsing. In the exemplified embodiment, two non-zero pulse levels 334 are utilized. The invention is not so limited, however, as any number of two or more pulse levels may be used. Further, the exemplified embodiment measures the parameters voltage, current, and phase at the RF input, and generates running parameter-related values (described below) based on these values, but the invention can measure any parameter (one or more) related to the load, and make that measurement at other locations in the system (e.g., the RF output of the matching network), and base the parameter-related values on any of those different parameters.

FIG. 9 provides a flow chart of the exemplified process 300 for impedance matching when the RF input signal has multi-level power setpoints. FIG. 10 provides a graph 330 of RF signal 332 having a first pulse level L1 and second pulse level L2, as well as the times 338, 339 for determining the parameter-related value. In the exemplified embodiment, the pulse level changes periodically at a pulse level interval 333, 334.

Returning to FIG. 9, the control circuit of the matching network detects whether the first pulse level is being provided (operation 302). If so, the control circuit measures the parameter related to the load for the first pulse level (operation 304), which in this embodiment includes the voltage (V), current (I), and phase (<D) at the input of the matching network (see parameters 336 in FIG. 10). These values can be measured independent of the RF source, or the system can synchronize sampling with when the RF source samples them. Based on the measured parameter, the control circuit will determine a parameter-related value for the first pulse level (operation 306), which will be used to alter the EVC (operation 308), provided the control unit determines that an alteration to the EVC is warranted.

The parameter-related value can be any value based on the one or more measured parameters. In its simplest form, the parameter-related value may be the measured parameter(s) itself. In the exemplified embodiment, however, the parameter-related value is based on previously-determined parameter-related values. Specifically, the new parameter-related value is an average of the current measured parameter and a predetermined number of previously-determined parameter-related values. For example, at the last time of times 338, the parameter-related value is the average of the parameter value at the last time of times 338 (the current time) and the parameter-related values determined at the first three times of times 338 (the previous three times). In other embodiments, other methods of using prior parameter-related value(s) may be used.

In the exemplified embodiment, the parameter-related value is used to calculate the input impedance at the RF input of the matching network ($Z_{input\ low}$). In other embodiments, other values can be determined, such as the reflection coefficient at the RF input of the matching network ($\Gamma_{input\ low}$). The exemplified system uses the calculated input impedance ($Z_{input\ low}$) (or related value such as $\Gamma_{input\ low}$) and the matching network's parameter matrix (such as one of the parameter matrices discussed above) to determine the load impedance ($Z_{output\ low}$). The system next uses the determined load impedance along with the desired input impedance at the input of the match (typically 50+j0) to determine the best configuration for the EVCs of the matching network—that is, to determine the best positions for the discrete capacitors of the EVCs ($EVC1_{low1}$ and $EVC2_{low2}$). In the exemplified embodiment, the matching network uses two EVCs, though in other embodiments more or less EVCs can be used. In another embodiment, the system could alter one or more EVCs in conjunction with altering an RF frequency, thus using a combination of capacitor tuning and frequency tuning. In this embodiment, the system will determine both the best EVC configuration and the best RF frequency value (e.g., $EVC1_{low1}$ and $freq1_{low1}$). In the exemplified embodiment, the matching network next changes the EVCs to their new configurations. Accordingly, EVC1 is changed to the $EVC1_{low1}$ position, and EVC2 is changed to the $EVC2_{low2}$ position. In other embodiments, other configurations may be used, such as changing to $EVC1_{low1}$ and $freq1_{low1}$. Note that the invention is not limited to the method for determining a match impedance discussed above. One or more of these steps may be omitted between determining the parameter-related value and the match configuration, and/or be substituted with another step for ultimately determining the new match configuration. For example, while the foregoing embodiments performed matching based on input impedance or a reflection coefficient, in other embodiments matching can be performed based on alternative values, such as maximum delivered energy during a pulse or minimum loss of energy during a pulse. Further, matching can be based on RF input phase and/or magnitude errors, on the measured reflected power, or on a load impedance measured directly at the output of the matching network.

Note that the system may include certain schemes that limit the extent to which the capacitor positions may be changed at a given time. For example, the alteration of the at least one EVC to provide the match configuration may be prevented from being carried out until a predetermined time has passed since a previous alteration of the at least one EVC. This scheme can ensure sufficient time has passed to allow the previous capacitor change to take effect. Further, in certain circumstances, a protection scheme may allow one of the EVCs to change to a newly determined position, but will not allow the other EVC (or EVCs) to move to a newly determined position (or positions). In other embodiments, the protection scheme may prevent any number of changes to the capacitor positions or frequency. In the exemplified embodiment, the changes that are permitted by the protection scheme will be made, while the other capacitor positions (or RF frequency) will be held at its current position (or frequency).

As shown in FIG. 10, during the first pulse interval 333, the control circuit will measure the parameter at several times 338 and repeat steps 302-308 for each time 338, regularly updating the parameter-related value. In the exemplified embodiment, the times 338 (and times 339) for calculating a new parameter-related value are separated by a time interval 340 that is 4 microseconds. In other embodiments, the time interval 340 can be of a different duration.

During first pulse interval 333, while a first level process 301A is being carried out, an independent second level process 301B is being carried out. While the first pulse level is being detected (operation 302), the second pulse level is not being detected (operation 312). During this first pulse interval 333, while the first level process 301A is measuring the parameter to determine the parameter-related value and alter the EVCs accordingly, second level process 301B is determining a parameter-related value for the second pulse level (operation 320) without measuring the parameter. This can be done by several methods. In the exemplified embodiment, presuming there were prior parameter measurements when the second pulse level L2 was ON, the parameter-related value will be based on a predetermined number of previously-determined parameter-related values. For example, the current parameter-related value may be based on an average of a predetermined number of previously determined parameter-related values. For example, while when the pulse is ON the parameter-related value is the average of the currently measured parameter value and three previously-determined parameter-related values, when the pulse is OFF the parameter-related value is the average of the four previously-determined parameter-related values. Thus, even when a given pulse level is OFF, a new parameter-related value can regularly be generated at each time interval 340. The parameter-related value is not simply a previously measured parameter value being held in memory until the pulse level is turned back ON, but is a value (for each pulse level) being newly determined at regular intervals, even when a given pulse level is OFF, to create a data bus of values.

At second pulse interval 335, the first pulse level L1 is OFF and the second pulse level L2 is ON. When this occurs, the first pulse level L1 and the second pulse level L2 switch roles. For the first pulse level (which is OFF), parameter-related values are determined at times 339 without use of a newly measured parameter (operation 310), similar to the process described with respect to operation 320 of the second-level process. For the second pulse level (which is ON), parameter-related values are determined (operation 316) at times 339 using new parameter measurements (314), and the at least one EVC is altered accordingly (operation 318). The different options for determining the parameter, the parameter-related value, and the match configuration apply to both the first level process 301A and the second level process 301B.

The above-disclosed process for impedance matching during level-to-level pulsing provides several advantages. There is no interruption in collecting parameter-related data, and the data set collected for each power level is practically continuous. As a result, the control loop can access this data at any time for determining new EVC and/or frequency settings. Because in a preferred embodiment this data also relies upon averaging the last few measured values, the disclosed method reduces the noise and sudden measurement changes associated with stopping and starting the measurement process. Further, the disclosed method of determining parameter values for each level, irrespective of whether the level is ON or OFF, allows the control system to treat each level as if it is its own matching network, thus increasing the flexibility and scalability of the control system to multi-level pulsing.

The above process may be carried out as part of a method of manufacturing a semiconductor. Such a manufacturing method may include placing a substrate in the plasma chamber configured to deposit a material layer onto the substrate or etch a material layer from the substrate; and energizing plasma within the plasma chamber by coupling RF power from the RF source into the plasma chamber to perform a deposition or etching. Further, the matching network described above may form part of a semiconductor processing tool (such as tool 86 in FIG. 3), the tool including the plasma chamber 19 and the matching network 11A.

Matching with Both CW Source and Pulsing Source

As indicated above, in semiconductor fabrication processing, multiple RF power sources are sometimes used to ignite and/or control the plasma properties. For example, multiple RF sources may be used to provide RF signals of differing frequencies. In some systems, a higher frequency RF source (e.g., 13 MHz) may be used to create a higher-density plasma. But since ions in the plasma may not move quickly if the frequency is high, the system may also use a lower frequency RF source (e.g., 2 MHz or 400 kHz) to move the ions.

Figure 11:
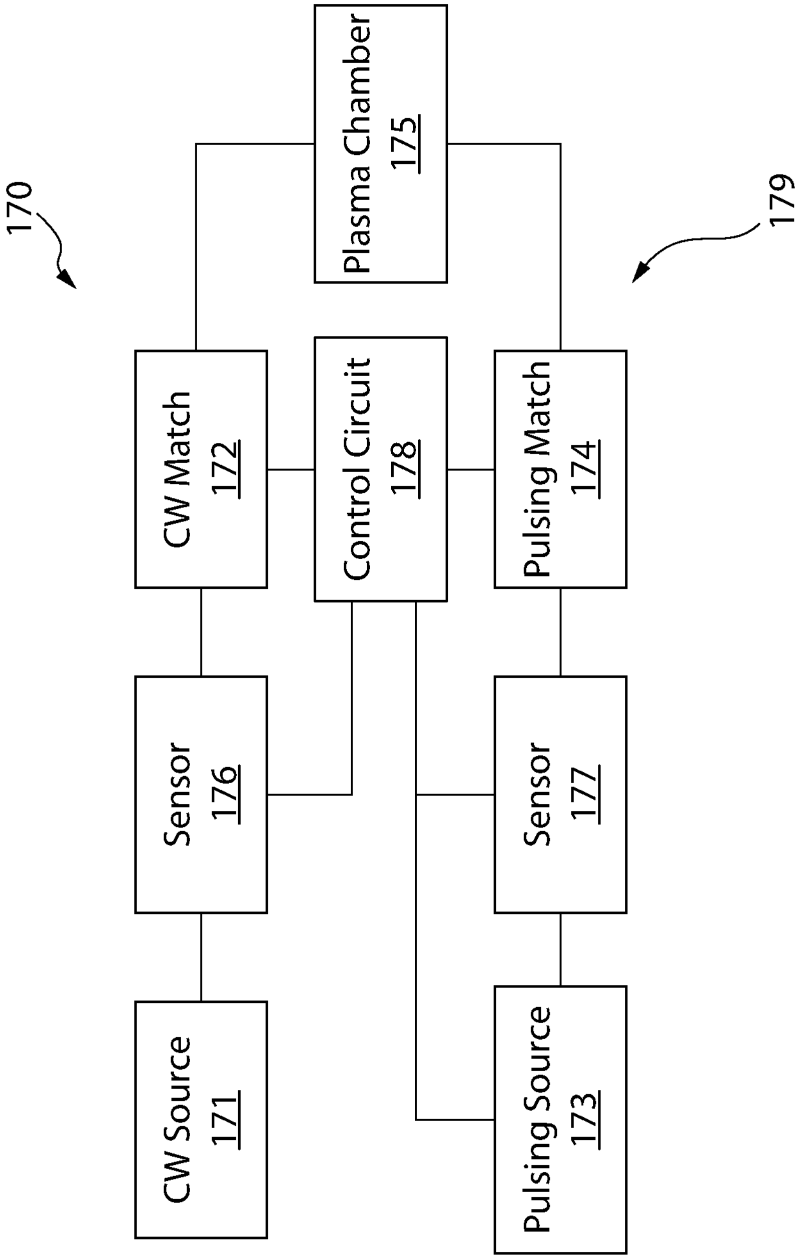
FIG. 11 is a block diagram of a multi-source semiconductor processing system according to one embodiment.

An example of such a multi-source system 170 is shown in FIG. 11, where the system includes a continuous wave (CW) source ("CW source") 171 and a pulsing source 173. The term "continuous wave" is understood herein to refer to an electromagnetic wave of substantially constant amplitude and frequency, or a sine wave. The multiple sources 171, 173 may be the same frequency or different frequencies. Similarly, the power levels of each may be different. The RF sources 171, 173 may have any of the features discussed above with regard to RF sources or RF generators. As will be explained in more detail below, the coexistence of a CW source and a pulsing source in a single system may impact the way matching may be performed.

A typical setup for providing RF power to a plasma chamber consists of at least one RF source (e.g., an RF Generator) 171, 173 providing power to at least one RF matching network 172, 174, which delivers the power to the plasma chamber 175. The matching networks 172, 174 are controlled by one or more control circuits 178. (See the discussions above for more details on how the matching network(s), control circuit(s), and plasma chamber may operate.) There can be multiple variations of this setup, where the RF source(s) and the RF matching network(s) are in separate enclosures with the power transmitted between them with a suitable RF coaxial cable. In other variations, the RF source and the RF matching network may be in the same enclosure with the RF coaxial cable between them replaced by a short coaxial cable or a strap. The reactive elements in the RF matching networks can be electromechanical, such as variable inductors or variable capacitors, or they can be an electronically variable type, such as a solid-state Electronically Variable Capacitor (EVC) as discussed herein.

As described in greater detail above, a semiconductor manufacturing system 170 may have sensors to sample signals. Such sensors 176, 177 are shown at the inputs of CW match 172 and pulsing match 174, respectively. They are comparable to sensor 21 of FIG. 2. Similar to FIG. 2, the sensors may alternatively be at other locations, such as at the match output, as shown in FIG. 2 by sensor 49. The signals sampled by the sensors 176, 177 may be processed to control the RF matching network. The sensors may be, for example, a directional coupler or a voltage-current (VI) and phase sensor at the input or output of the matching network. The matching network's automatic control varies the internal reactive elements (e.g., variable capacitors 31, 33 of FIG. 2) to convert the varying plasma load impedance to a stable input impedance that matches the output impedance of the RF source (e.g., the RF source and the coaxial cable between the RF source and the matching network).

Figure 12:
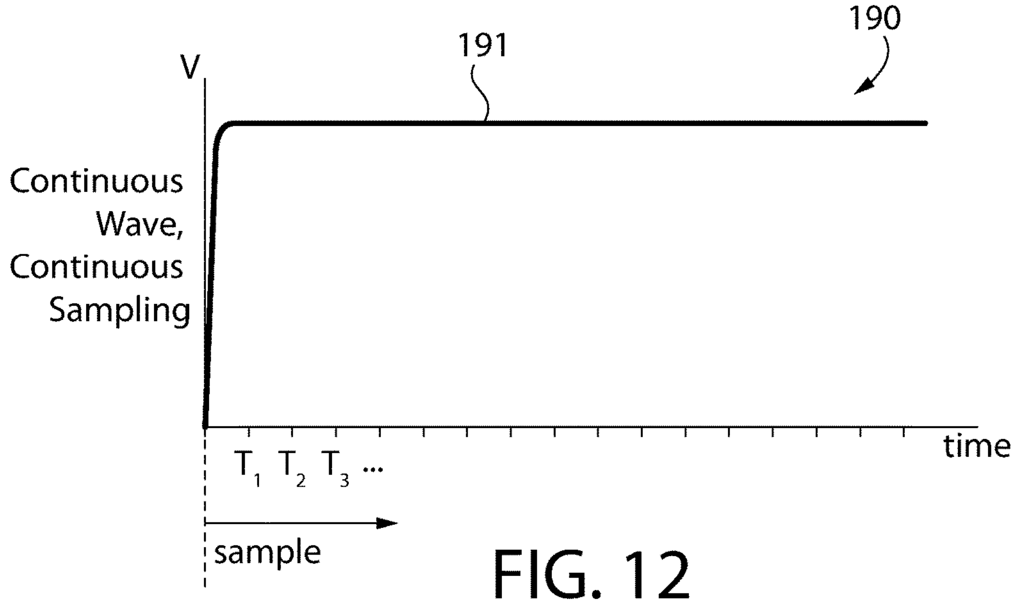
FIG. 12 is a graph showing a continuous sampling approach for an RF source in continuous wave mode according to one embodiment.
Figure 13:
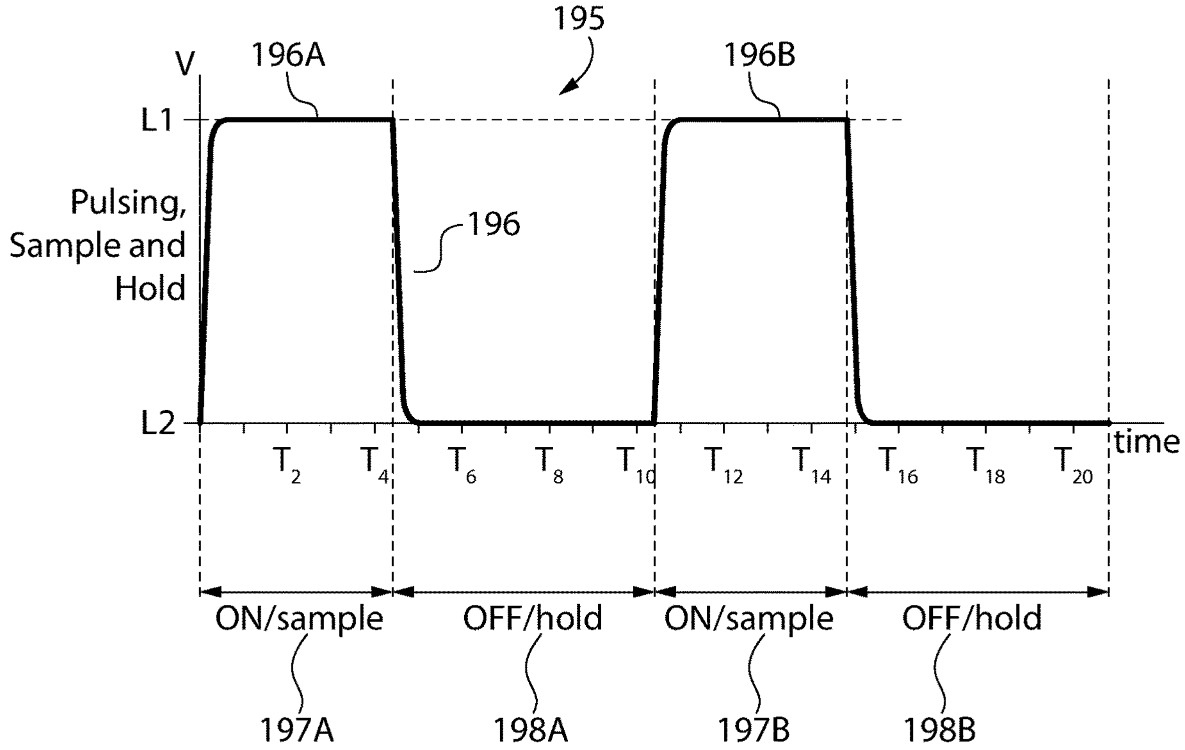
FIG. 13 is a graph showing a sample-and-hold approach for an RF source that is pulsing according to one embodiment.
Figure 15:
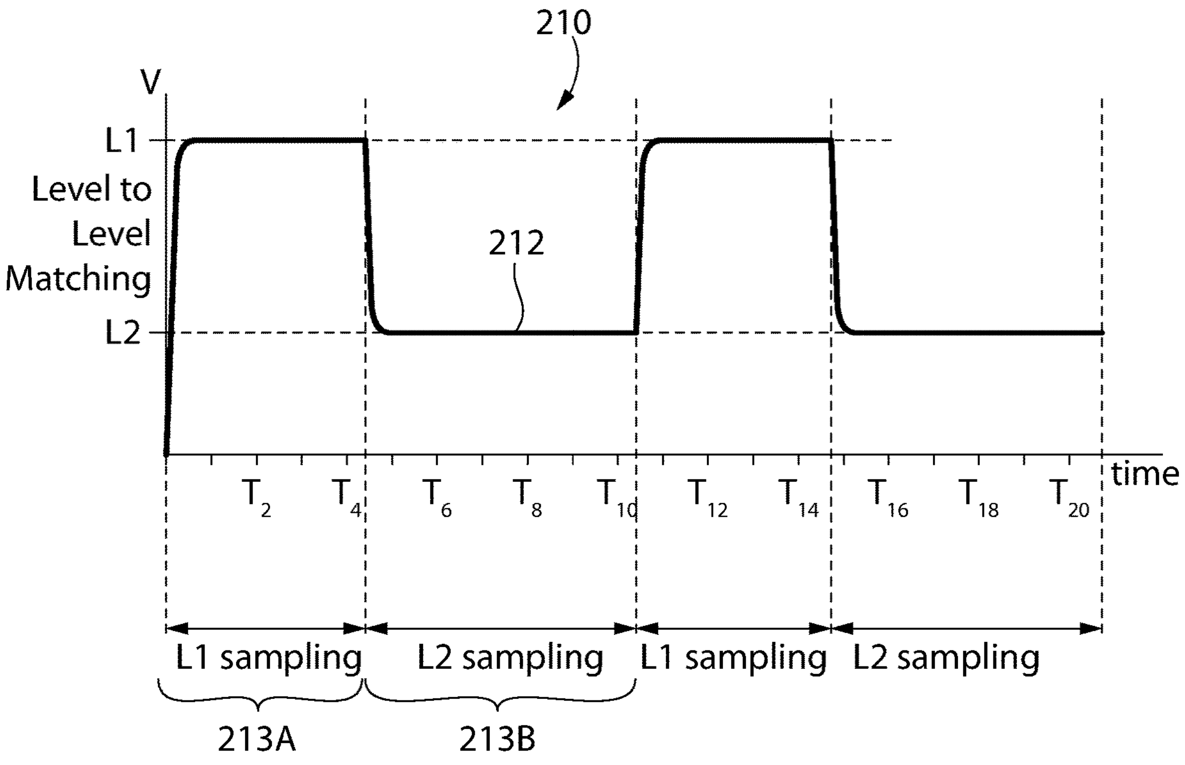
FIG. 15 is a graph showing sampling of different pulse levels according to one embodiment.

Methods for tuning the load impedances during CW and pulsing conditions, however, may be different. FIG. 12 is a graph 190 showing a continuous sampling approach for an RF source 171 in CW mode. The graph shows the voltage (represented by waveform 191) sampled by the sensor 176 (or derived from a value sampled at the sensor) at the RF input of CW match 172 over time. Each of the indicated times ($T_1$, $T_2$, $T_3$, etc.) may indicate a time when sampling occurs. Note further that FIGS. 12, 13, and 15 do not show the original AC signal, which in the case of a CW signal would appear as a continuous sine wave. Instead waveform 191 (and waveform 196 of FIG. 13 and waveform 212 of FIG. 15) may be understood to depict an envelope of the original AC signal, or a DC signal derived from the original AC signal. Further, while FIGS. 12 and 13 show sampling of the parameter of voltage, as discussed above with respect to FIG. 10, other parameters may be sampled, such as current and/or phase. Note that the parameters may alter as the conditions in the plasma chamber alter.

According to the continuous sampling approach, the matching network 172 may continuously sample the parameter and adjust the reactive elements (e.g., the variable capacitors) of the matching network 172 to the best positions for providing minimum reflected power at the input of the matching network. Thus, sampling occurs at times $T_1$, $T_2$, $T_3$, and so on.

By contrast, FIG. 13 is a graph 195 showing a "sample-and-hold" approach for an RF source 173 that is pulsing. This graph is similar to those shown in FIG. 10, where a multi-level signal is being sampled at regular time intervals. The graph shows the voltage (represented by waveform 196) sampled by the sensor 177 at the RF input of pulsing match 174 over time. (In other embodiments, other parameters may be sampled, such as current or phase.) The pulses are shown by portions 196A and 196B of the waveform 196. According to this approach, the matching network 174 only samples the sensor signals (or only uses the values obtained from sampling the sensor signals) for the times when the RF pulse in ON (times 197A, 197B), and thus does not sample (or not use the values obtained from sampling the sensor signals) for the times when the RF pulse is OFF (times 198A, 198B), but rather "holds" the signals or parameter values sampled during the previous RF pulse ON period in memory. Thus, for example, sampling occurs at times $T_1$ to $T_4$, does not occur at times $T_5$ to $T_{10}$, resumes with time $T_{11}$, and so on. In this way, when the RF source is pulsing, the matching network is tuning only using the signals and parameter values sampled during the time the RF pulse was ON 197A, 197B.

Challenges to Using CW and Pulsing Sources in Same System

Problems may arise when one of the RF sources is CW and the other is pulsing. When a pulsing RF power is delivered to the plasma chamber, the plasma load impedance varies at the pulse frequency. Returning to FIG. 11, this causes the CW source 171 to see a pulsing plasma with its load impedance changing at the pulsing frequency. But if the CW match 172 is in a CW mode, since its own source 171 is CW, it will sample the sensor signals continuously as in FIG. 12. A typical RF matching network that uses electromechanical elements, such as vacuum variable capacitors (VVCs), is unable to tune to this rapidly varying plasma load, and therefore some of the incident power is reflected back to the RF generator. In semiconductor processing, where the power delivered to the plasma chamber and the process itself is very tightly controlled, this reflected power back to the RF generator adds to variation in plasma processing and ultimately to process yield.

As will be described in more detail below, disclosed are systems and methods for impedance matching in a system that includes a CW RF source (configured to provide a CW RF signal to a load) and a pulsing RF source (configured to provide a pulsing RF signal to the load, where the pulsing RF signal may have multiple pulse levels having different time durations). A matching network is operably coupled between the CW RF source and the load, the matching network comprising at least one variable reactance element (which may be mechanically or electronically variable). A control circuit may be operably coupled to (a) the matching network and (b) at least one of the pulsing RF source or a sensor positioned between the pulsing RF source and the load, as shown in FIG. 11. At a high level, the control circuit may be understood to carry out the following operations: receive one or more signals indicative of the pulsing RF signal; select a portion of the pulsing RF signal (such as selecting between different pulse level time durations, as discussed in more detail below); sample at least one parameter during the selected portion of the pulsing RF signal (e.g., during the selected pulse level time duration); and cause the matching network to impedance match between the CW RF source and the load by altering the at least one variable reactance element based on the sampled at least one parameter. Note that causing an impedance match will reduce reflected power to the relevant RF source, but does not require entirely eliminating any such reflected power.

The first approach discussed in more detail below is referred to as a "modified sample-and-hold" approach. In this approach, the selection of a portion of the pulsing RF signal may be selecting between different pulse level time durations. For example, the control circuit may determine which pulse level time duration is longer, and then cause the CW source's matching network to match based on sampling that occurs during the longer pulse time duration. The second approach discussed in more detail below is specific to solid-state matching and is referred to herein as the "level-to-level" approach. In this approach, for a first pulse level, the control circuit identifies the portion of the pulsing RF signal that is the first level time duration and samples a parameter related to the CW source during that time to cause an impedance match for the first pulse level. Further, for the second pulse level, the control circuit identifies the portion of the pulsing RF signal that is the second time level time duration and samples a parameter related to the CW source during that time to cause an impedance match for the second pulse level. The control circuit may alternate between matching for each of the pulse levels, having separate parameter data used for each of the pulse levels.

Modified Sample-and-Hold Matching with CW Source and Pulsing Source

The following provides a first solution to match when using a CW source and a pulsing source in the same system. As will be explained in more detail below, the CW source uses a modified sample-and-hold approach to address the presence of a pulsing plasma. This method may use pulsing information from the pulsed RF source to control how the CW match and source control the matching operation.

Figure 14:
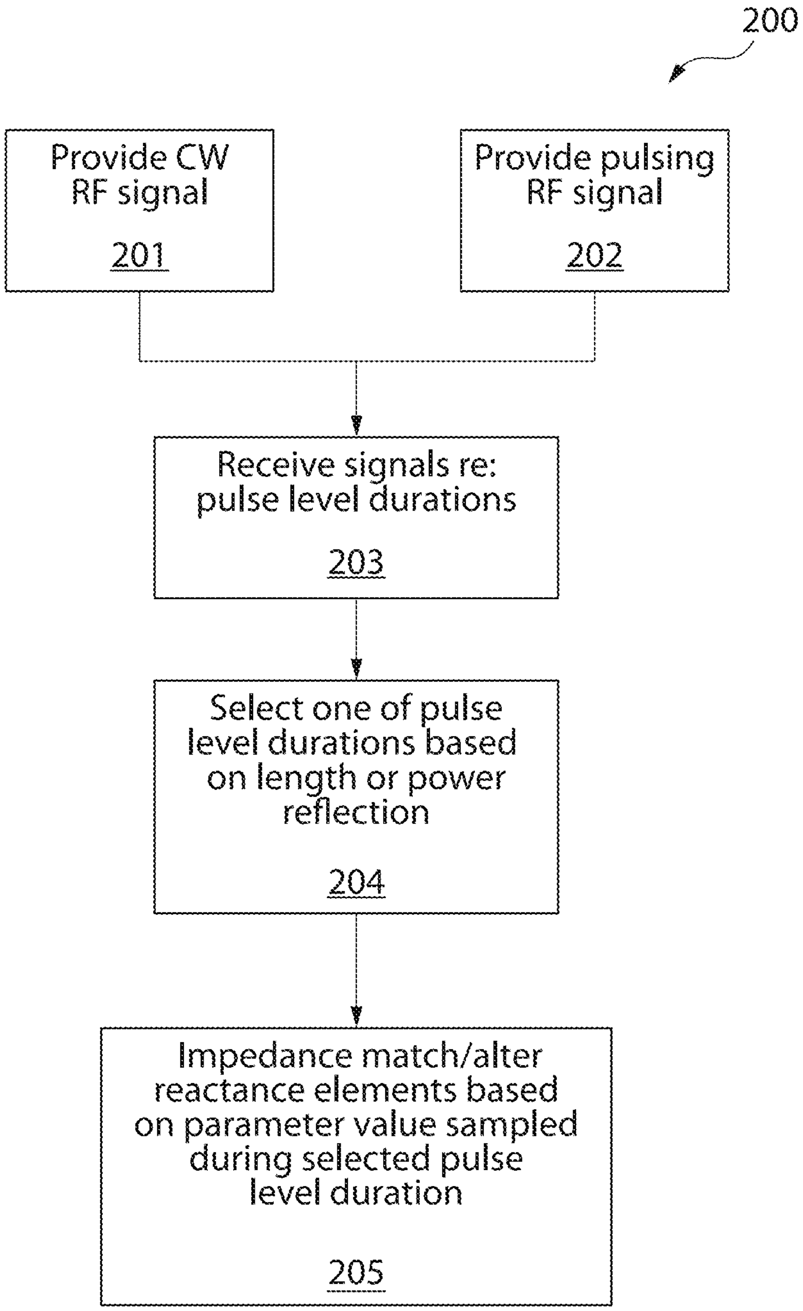
FIG. 14 is a flowchart of a modified sample-and-hold approach to impedance matching in a system with both CW and pulsing RF sources according to one embodiment.

FIG. 14 is a flow chart of a method of impedance matching using a modified sample-and-hold approach according to one embodiment. The following description will reference FIGS. 11-14. In operation 201, CW RF source 171 provides a CW RF signal 191 to a load (plasma chamber 175). The CW signal may be similar to that shown in FIG. 12. In operation 202, a pulsing RF source 173 provides a pulsing RF signal, such as pulsing RF signal 196 of FIG. 13, to the load (plasma chamber 175). Note that the pulsing RF source discussed herein may comprise, for example, an RF generator capable of providing a pulsing signal. The pulsing RF source may alternatively comprise both an RF generator and a separate pulse controller that modulates the RF signal output by the RF generator to thereby cause a pulsing RF signal. These examples are non-limiting. The exemplified pulsing RF signal 196 has a first pulse level L1 having a first pulse level time duration 197A, and a second pulse level L2 having a second pulse level time duration 198A. Note that in this embodiment the first pulse level L1 is an ON state and the second pulse level is an OFF state. The invention is not so limited, however. For example, the first and second pulse levels may both be non-zero levels. Further, the RF signal may have more than two non-zero pulse levels.

The CW match 172 is operably coupled between the CW RF source 171 and the plasma chamber 175. The matching network includes at least one variable reactance element. This variable reactance element may be adjusted to cause or help cause impedance matching. It may be a mechanically-variable capacitor or inductor, such as a vacuum variable capacitor, or an electronically variable (solid state) capacitor or inductor where the component reactance elements are fixed capacitors or fixed inductors (such as an electronically variable capacitor as discussed above). In certain embodiments, impedance matching may be further enabled by altering a frequency of the CW RF signal.

A control circuit 178 is coupled to the CW match 172 and the pulsing match 174. The exemplified control circuit is operably coupled to both matches, while in other embodiments the control circuit may comprise more than one control circuit, such as where each match has a control circuit. In step 203, the control circuit 178 receives one or more signals indicative of the first pulse level time duration 197A and the second pulse level time duration 198A for the pulsing RF source 173. These signals indicative of the pulse level time durations may be received, for example, from the pulsing source 173, from the sensor 177, or from the pulsing match 174. In step 204, the control circuit selects one of the first pulse level time duration and the second pulse level time duration based on (a) which of the time durations is longer, and/or (b) which of the time durations results in less power being reflected to the CW RF source. It is noted that neither sensor 177 nor pulsing match 174 is essential to the embodiments disclosed herein.

Regarding method (b) (selecting which of the time durations results in less power being reflected to the CW RF source), this determination may be based on (i) making a determination of a reflection-related value during the first pulse level time duration, and (ii) making a determination of a reflection-related value during the second pulse level time duration. For example, the reflection-related value can be the reflection coefficient, which represents the ratio of the amplitude of the reflected wave to the incident wave, and is sometimes referred to as gamma. This value can be measured by sensor 176 at the RF source output and match input (or at the match output). In other embodiments, the reflection-related value can be the reflected power, which may be measured at a similar position. The system may determine the reflection-related value during each of the time durations to determine which time duration results in less reflected power (e.g., a lower gamma) and then select that time duration.

In step 205, the control circuit 178 then causes the matching network 172 to perform impedance matching between the CW RF source 171 and the load 175 by altering the at least one variable reactance element of the matching network 172 to a new position. Note that the term "position" as used herein refers broadly to any position, configuration, or value for a variable reactance element. For example, a new position for a VVC could be a new physical position for the component parts, or a new numerical capacitance value to be brought about by altering the VVC. Further, a new position for an EVC may refer to a new set of ON/OFF states (configurations) for the component fixed capacitors, or a new numerical capacitance value to be brought about by altering the ON/OFF states of the component fixed capacitors.

The new position is based on at least one parameter value sampled during the selected time duration. Thus, for example, if the time duration is based on which time duration is longer, then the OFF time duration 198A, which is longer than the ON time duration 197A, will be selected. Thus, the new position will be based on a parameter sampled at one or more of times $T_5$ to $T_{10}$, and not on a parameter sampled during the non-selected (ON) time duration (times $T_1$ to $T_4$). In this embodiment, matching will subsequently be performed based on at least one parameter sampled during times $T_{11}$ to $T_{14}$, but not during times $T_{15}$ to $T_{20}$. This process may continue to repeat with each new pulse. As described above, in other embodiments the selected duration may be based on which level and associated time duration results in less power being reflected. In yet another embodiment, the system can select the time duration based on which is longer, but when the durations are the same then the system chooses the time duration that results in less power being reflected. In yet other embodiments, other factors may be used to select the time duration that is used for matching.

In another embodiment, the control circuit may determine, for each of the time durations, the match VRE positions causing minimal reflected power for that time duration, and then determine new VRE positions in between those match VRE positions such that the new VRE positions provide an overall reflected power that is minimum for the full duration of the first and second pulse levels.

In yet another embodiment, the control circuit may sample sensor signals and determine reflected power throughout either duration of the pulse over multiple pulse durations, and then use an algorithm to minimize the integral (i.e., sum) of reflected power over time, not just at one point. This algorithm may be designed to deliver maximum power to the chamber and not necessarily a minimum reflected power at a particular time in the pulse level time duration.

The above process may be carried out as part of a method of manufacturing a semiconductor. Such a manufacturing method may include placing a substrate in the plasma chamber configured to deposit a material layer onto the substrate or etch a material layer from the substrate, and energizing plasma within the plasma chamber by coupling RF power from the RF sources 171, 173 into the plasma chamber 175 to perform a deposition or etching. Further, the matching network described above may form part of a semiconductor processing tool (such as tool 179 of FIG. 11), the tool including the plasma chamber 175, the matching network 172, and the control circuit 178.

Level-to-Level Solid State Matching with CW Source and Pulsing Source

The modified sample-and-hold approach described above may be used for a variety of matching networks, including those that are not solid state. The following alternative approach is specific to solid state matching networks, such as those performing impedance matching using electronically variable capacitors or inductors and/or frequency tuning (as opposed to matching networks using, for example, mechanically-variable reactance elements). The embodiment described above uses electronically variable capacitors (EVCs) as its variable reactive elements, but the invention is not so limited.

As discussed above, a solid state matching network is fast enough to tune at each level of a multi-level pulse signal (level-to-level pulsing). Returning to FIG. 11, a semiconductor manufacturing system 170 may comprise two RF sources—a pulsing source 173 and a continuous wave (CW) source 171. In the following embodiment as shown in the graph 210 of FIG. 15, the pulsing source 173 provides a multi-level pulse signal 212 comprising two non-zero pulse levels L1, L2, though the invention is not so limited. The level-to-level approach described above takes advantage of the speed of solid state matching networks, enabling the system to tune at each level, rather than picking a level or otherwise using a shared value. The level-to-level approach described below applies this tuning at each level to matching for the CW source.

As discussed above, when a system has both a pulsing and a CW RF source, the pulsing RF source causes the plasma to pulse, thus creating a challenge for the CW RF source and match that is sampling continuously and expects a consistent plasma impedance. While the modified sample-and-hold approach provides the CW side one method for addressing this pulsing plasma, the following level-to-level approach addresses this issue by taking advantage of the speed of a solid state matching network.

Figure 16:
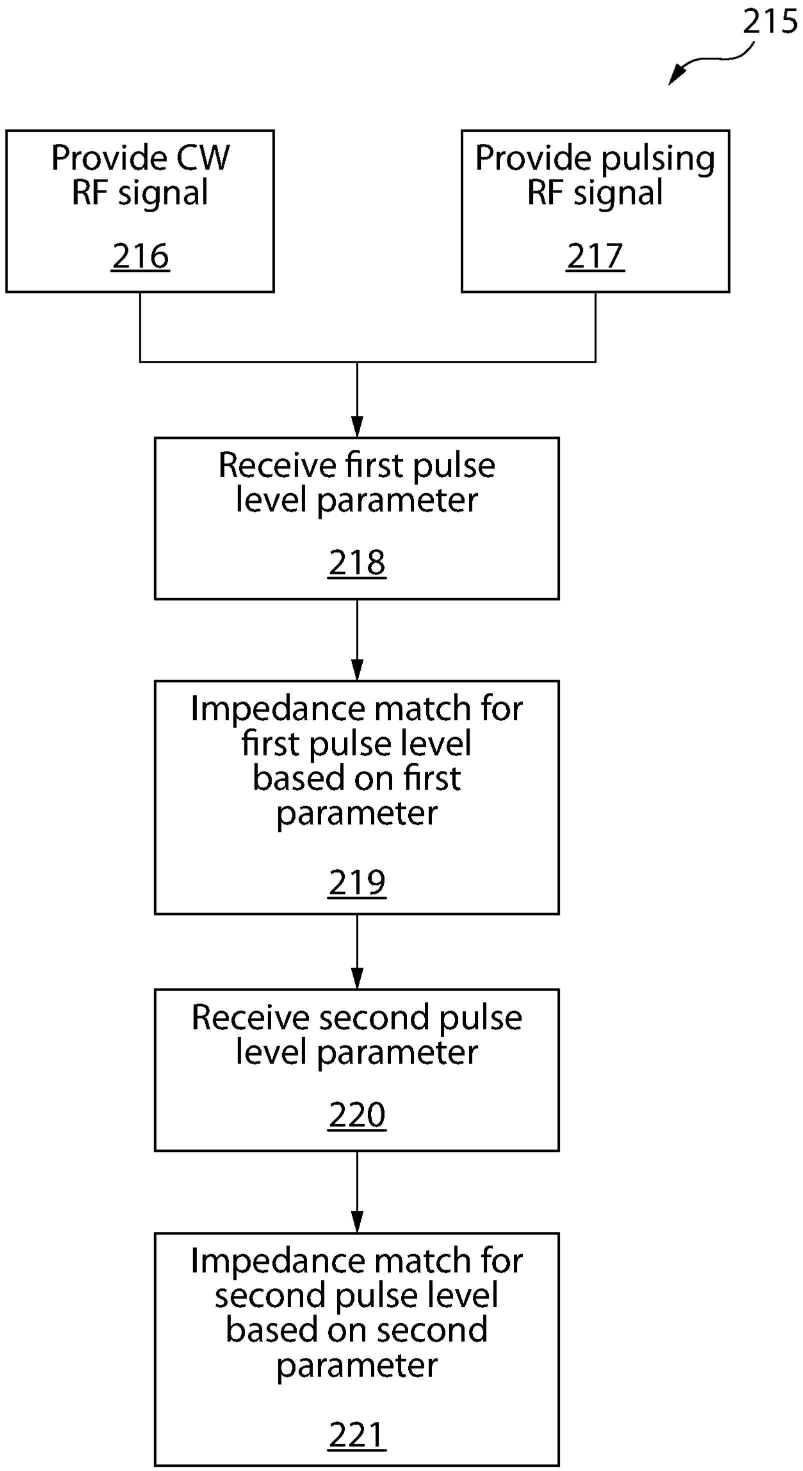
FIG. 16 is a flowchart of a level-to-level approach to impedance matching in a system with both CW and pulsing RF sources according to one embodiment.

According to this approach, the control circuit uses the pulsing information to control the matching for the CW side. The description below will reference the block diagram of FIGS. 11, the graph 210 of FIG. 15, and the flowchart 215 of FIG. 16. The CW RF source 171 provides a CW RF signal to the plasma chamber 175 (operation 216). The pulsing RF source 173 provides a pulsing RF signal 212 to the plasma chamber 175 (operation 217), the pulsing RF signal 212 comprising a first pulse level L1 having a first pulse level time duration 213A and a second pulse level L2 having a second pulse level time duration 213B. Note that other embodiments may use any number of pulse levels. The CW matching network 172 is operably coupled between the CW RF source 171 and the plasma chamber 175. The exemplified CW matching network includes at least one electronically variable reactance element (EVRE) (see, e.g., FIG. 2 and EVCs 31, 33). The control circuit may receive information on the pulse level time duration from, for example, pulsing source 173, sensor 177, or pulsing match 174.

The control circuit 178 is configured to receive a signal indicative of a parameter sampled by sensor 176 during the first pulse level time duration 197A (operation 218). The control circuit is further configured, for the first pulse level, to cause the impedance matching network to enable impedance matching between the CW RF source and the plasma chamber by altering the at least one EVRE based on the parameter value sampled during the first pulse level time duration (operation 219).

The control circuit may also carry out a similar operation for the second pulse level. That is, the control circuit 178 receives a signal indicative of a parameter value sampled during the second pulse level time duration (operation 220). The control circuit then, for the second pulse level, causes the impedance matching network to enable impedance matching between the CW RF source and the load by altering the at least one EVRE based on the parameter value sampled during the second pulse level time duration (operation 221). Accordingly, the first level matching is based on sampling data for the first level, and the second level matching is based on sampling data for the second level.

The control circuit (which may be a single control circuit or a combination of circuits for each of the CW match and the pulsing match) may store the sampled signals for each of the pulse levels separately. For example, if the sensor 176 is a voltage, current, and phase sensor, the sensor 176 may sample (and the control circuit may store the parameter values for) voltage, current, and phase (and other associated RF signals from other sensors) for the first pulse level time duration, and separately store such values for the second pulse level time duration. Thus, for each of the levels, the control circuit may store a corresponding set of sampled values that are used to determine the best match settings (e.g., the best EVC positions) for minimum reflected power at the matching network input. The CW matching network may then switch between these two match settings (e.g., EVC positions) in sync with the changing RF pulse, such that each pulse level is best tuned to provide minimum reflected power at the input of the match. Thus, the control circuit may repeat the foregoing operations as the pulsing RF source alternates between the first pulse level and the second pulse level. A similar control algorithm may be applied if the sensor 176 is based on directional coupler technology, with forward and reflected power signals sampled for each pulse level duration.

The system 170 described above may include a second matching network (pulsing match 174) operably coupled between the pulsing RF source 173 and the plasma chamber 175. The pulsing match 174 may also comprise at least one EVRE. The pulsing match may enable impedance matching between the pulsing RF source and the plasma chamber by a method similar to that described above for the CW match 172. That is, for the first pulse level, the at least one EVRE of the pulsing match may be altered based on the parameter value sampled during the first pulse level time duration. For the second level, the at least one EVRE of the pulsing match 174 may be altered based on the parameter value sampled during the second pulse level time duration.

It is noted that the EVRE discussed herein may be any type of electronically variable reactance element, including an electronically variable capacitor, such as the EVCs discussed above that comprise fixed capacitors coupled in parallel, and an electronically variable inductor. Matching may also be enabled by altering a frequency of the CW RF signal (frequency tuning).

Further, the control algorithm may be designed to "learn" the best match (e.g., EVC) positions by constantly calculating the best match position and, when power level and matching positions are found to be changing in a predictable pattern, no longer calculating the new EVC positions and instead moving to the new positions as determined by the machine learning algorithm.

The above process may be carried out as part of a method of manufacturing a semiconductor. Such a manufacturing method may include placing a substrate in the plasma chamber configured to deposit a material layer onto the substrate or etch a material layer from the substrate, and energizing plasma within the plasma chamber by coupling RF power from the RF sources 171, 173 into the plasma chamber 175 to perform a deposition or etching. Further, the matching network described above may form part of a semiconductor processing tool (such as tool 179 of FIG. 11), the tool including the plasma chamber 175, the matching network 172, and the control circuit 178.

It is further noted that the additional considerations discussed above with respect to level-to-level matching as discussed with regard to FIGS. 9 and 10 may be incorporated into the above multi-source matching approaches.

While the embodiments of a matching network discussed herein have used L or pi configurations, it is noted that the claimed matching network may be configured in other matching network configurations, such as a 'T' type configuration. Unless stated otherwise, the variable capacitors, switching circuits, and methods discussed herein may be used with any configuration appropriate for an RF impedance matching network.

While the embodiments discussed herein use one or more variable capacitors in a matching network to achieve an impedance match, it is noted that any variable reactance element can be used. A variable reactance element can include one or more discrete reactance elements, where a reactance element is a capacitor or inductor or similar reactive device.

This application incorporates by reference in its entirety commonly-owned U.S. Pat. No. 10,460,912, U.S. Pub. No. US2021/0327684, U.S. Pub. No. US2021/0327684, and U.S. Pat. No. 10,984,985.

While the inventions have been described with respect to specific examples including presently preferred modes of carrying out the invention, those skilled in the art will appreciate that there are numerous variations and permutations of the above described systems and techniques. It is to be understood that other embodiments may be utilized and structural and functional modifications may be made without departing from the scope of the present inventions. Thus, the spirit and scope of the inventions should be construed broadly as set forth in the appended claims.

What is claimed is:

1. A system comprising:

a continuous wave (CW) radio frequency (RF) source configured to provide a CW RF signal to a load;

a pulsing RF source configured to provide a pulsing RF signal to the load, wherein the pulsing RF signal comprises (a) a first pulse level having a first pulse level time duration, and (b) a second pulse level having a second pulse level time duration;

a matching network operably coupled between the CW RF source and the load, the matching network comprising at least one variable reactance element; and a control circuit operably coupled to (a) the matching network and (b) at least one of the pulsing RF source and a sensor positioned between the pulsing RF source and the load, wherein the control circuit is configured to:

receive one or more signals indicative of the pulsing RF signal;

select a portion of the pulsing RF signal, wherein the selection of the portion of the pulsing RF signal comprises selecting one of the first pulse level time duration and the second pulse level time duration based on (a) which of the pulse level time durations is longer; or (b) which of the pulse level time durations results in less power being reflected to the CW RF source;

sample at least one parameter during the selected portion of the pulsing RF signal; and cause the matching network to impedance match between the CW RF source and the load by altering the at least one variable reactance element based on the sampled at least one parameter.

2. The system of claim 1 wherein the alteration of the at least one variable reactance element is not based on any parameter value sampled during the non-selected pulse level time duration.

3. The system of claim 1 further comprising a second matching network operably coupled between the pulsing RF source and the load, the second matching network comprising at least one variable reactance element.

4. The system of claim 1 wherein the load is a plasma chamber and the sampled at least one parameter comprises a voltage, a current, or a phase between the CW RF source and the matching network.

5. The system of claim 1 wherein the first pulse level is an ON state and the second pulse level is an OFF state.

6. The system of claim 1 wherein the selected pulse level time duration is based on which of the pulse level time durations results in less power being reflected to the CW RF source, which is based on:

a determination of a reflection-related value during the first pulse level time duration; and a determination of the reflection-related value during the second pulse level time duration.

7. The system of claim 1 wherein the at least one variable reactance element comprises at least one vacuum variable capacitor.

8. The system of claim 1 wherein the impedance matching between the CW RF source and the load is further enabled by altering a frequency of the CW RF signal.

9. The method of claim 1 further comprising a second matching network operably coupled between the pulsing RF source and the load, the second matching network comprising at least one variable reactance element.

10. A method of impedance matching comprising:

providing, from a CW RF source, a CW RF signal to a load;

providing, from a pulsing RF source, a pulsing RF signal to the load, wherein the pulsing RF signal comprises (a) a first pulse level having a first pulse level time duration, and (b) a second pulse level having a second pulse level time duration;

operably coupling a matching network between the CW RF source and the load, the matching network comprising at least one variable reactance element;

operably coupling a control circuit to (a) the matching network and (b) at least one of the pulsing RF source and a sensor positioned between the pulsing RF source and the load;

receiving one or more signals indicative of the pulsing RF signal;

selecting a portion of the pulsing RF signal, wherein the selection of the portion of the pulsing RF signal comprises selecting one of the first pulse level time duration and the second pulse level time duration based on (a) which of the pulse level time durations is longer; or (b) which of the pulse level time durations results in less power being reflected to the CW RF source;

sampling at least one parameter during the selected portion of the pulsing RF signal; and causing the matching network to impedance match between the CW RF source and the load by altering the at least one variable reactance element based on the sampled at least one parameter.

11. The method of claim 10 wherein the alteration of the at least one variable reactance element is not based on any parameter value sampled during the non-selected pulse level time duration.

12. The method of claim 10 wherein the load is a plasma chamber and the sampled at least one parameter comprises a voltage, a current, or a phase between the CW RF source and the matching network.

13. The method of claim 10 wherein the first pulse level is an ON state and the second pulse level is an OFF state.

14. The method of claim 10 wherein the selected pulse level time duration is based on which of the pulse level time durations results in less power being reflected to the CW RF source, which is based on:

a determination of a reflection-related value during the first pulse level time duration; and a determination of the reflection-related value during the second pulse level time duration.

15. The method of claim 10 wherein the at least one variable reactance element comprises at least one vacuum variable capacitor.

16. The method of claim 10 wherein the impedance matching between the CW RF source and the load is enabled by altering a frequency of the CW RF signal.

17. A semiconductor processing tool comprising:

a plasma chamber configured to deposit a material onto a substrate or etch a material from the substrate;

a first impedance matching network operably coupled to the plasma chamber and configured to be operably coupled to a CW RF source configured to provide a CW RF signal to the plasma chamber, the first impedance matching network comprising at least one variable reactance element;

a second impedance matching network operably coupled to the plasma chamber and configured to be operably coupled to a pulsing RF source configured to provide a pulsing RF signal to the plasma chamber, wherein the pulsing RF signal comprises (a) a first pulse level having a first pulse level time duration, and (b) a second pulse level having a second pulse level time duration; and a control circuit operably coupled to (a) the first impedance matching network and (b) at least one of the pulsing RF source and a sensor positioned between the pulsing RF source and the plasma chamber, wherein the control circuit is configured to:

receive one or more signals indicative of the pulsing RF signal;

select a portion of the pulsing RF signal, wherein the selection of the portion of the pulsing RF signal comprises selecting one of the first pulse level time duration and the second pulse level time duration based on (a) which of the pulse level time durations is longer; or (b) which of the pulse level time durations results in less power being reflected to the CW RF source;

sample at least one parameter during the selected portion of the pulsing RF signal; and cause the first impedance matching network to impedance match between the CW RF source and the plasma chamber by altering the at least one variable reactance element based on the sampled at least one parameter.

18. The tool of claim 17 wherein the alteration of the at least one variable reactance element is not based on any parameter value sampled during the non-selected pulse level time duration.

19. The tool of claim 17 wherein the first pulse level is an ON state and the second pulse level is an OFF state.

20. The tool of claim 17 wherein the selected pulse level time duration is based on which of the pulse level time durations results in less power being reflected to the CW RF source, which is based on:

a determination of a reflection-related value during the first pulse level time duration; and a determination of the reflection-related value during the second pulse level time duration.

* * * * *